United States Patent [19]
Mochizuki

[11] Patent Number: 5,353,304
[45] Date of Patent: Oct. 4, 1994

[54] SURFACE ACOUSTIC WAVE DEVICE, AND DEMODULATING APPARATUS AND COMMUNICATION SYSTEM USING THE SURFACE ACOUSTIC WAVE DEVICE

[75] Inventor: Norihiro Mochizuki, Machida, Japan

[73] Assignee: Canon Kabushiki Kaisha, Tokyo, Japan

[21] Appl. No.: 183,255

[22] Filed: Jan. 19, 1994

Related U.S. Application Data

[63] Continuation of Ser. No. 55,347, May 3, 1993, abandoned.

[30] Foreign Application Priority Data

May 8, 1992 [JP] Japan ............... 4-142059
Jun. 29, 1992 [JP] Japan ............... 4-192807

[51] Int. Cl.$^5$ ............................... H01L 41/04
[52] U.S. Cl. ................ 375/1; 310/313 D; 333/153; 333/195
[58] Field of Search ............ 375/1; 310/313 D; 333/153, 195

[56] References Cited

U.S. PATENT DOCUMENTS

| | | | |
|---|---|---|---|
| 4,035,675 | 7/1977 | Malocha et al. | 310/9.8 |
| 4,114,116 | 9/1978 | Reeder | 333/30 R |
| 4,234,930 | 11/1980 | Campbell | 364/724 |
| 4,434,481 | 2/1984 | Toda et al. | 369/132 |
| 4,504,759 | 3/1985 | Schofield | 310/313 C |
| 4,659,955 | 4/1987 | Schofield | 310/313 D |
| 4,697,115 | 9/1987 | Mitsutsuka | 310/313 R |
| 5,164,628 | 11/1992 | Egara et al. | 310/313 |
| 5,200,663 | 4/1993 | Mochizuki et al. | 310/313 |

FOREIGN PATENT DOCUMENTS 0409538 1/1991 European Pat. Off. .

OTHER PUBLICATIONS

"Acoustic-Surface-Wave Analogue-Digital Converter"; by G. Baldwin et al.; Electronics Letters; vol. 10, No. 11, May 30, 1974, Enage, Great Britain; pp. 225–227.

*Primary Examiner*—David C. Cain
*Attorney, Agent, or Firm*—Fitzpatrick, Cella, Harper & Scinto

[57] ABSTRACT

In a surface acoustic wave device, there are arranged a piezoelectric substrate, an input electrode and an output electrode. The input electrode is formed on the substrate, and generates a surface acoustic wave propagated in a predetermined direction, in accordance with an input signal. The output electrode is also formed on the substrate, and converts the surface acoustic wave to an electric signal. One of the input and output electrodes includes a plurality of taps equidistantly arranged in a propagation direction of the surface acoustic wave. The other one of the input and output electrodes may comprise a pair of taps arranged at a predetermined distance in the propagation direction. The electrode including a plurality of taps or the electrode including a pair of taps satifies a predetermined relation established among a length between the taps, a transmission speed of the input signal, a propagation velocity of the surface acoustic wave and so forth. According to such a structure, two bits of the signal can be processed without a delay circuit. A demodulating device and a communication system respectively include the surface acoustic wave device so that a circuit structure can be simplified and that data can be reproduced with a high signal quality.

70 Claims, 9 Drawing Sheets

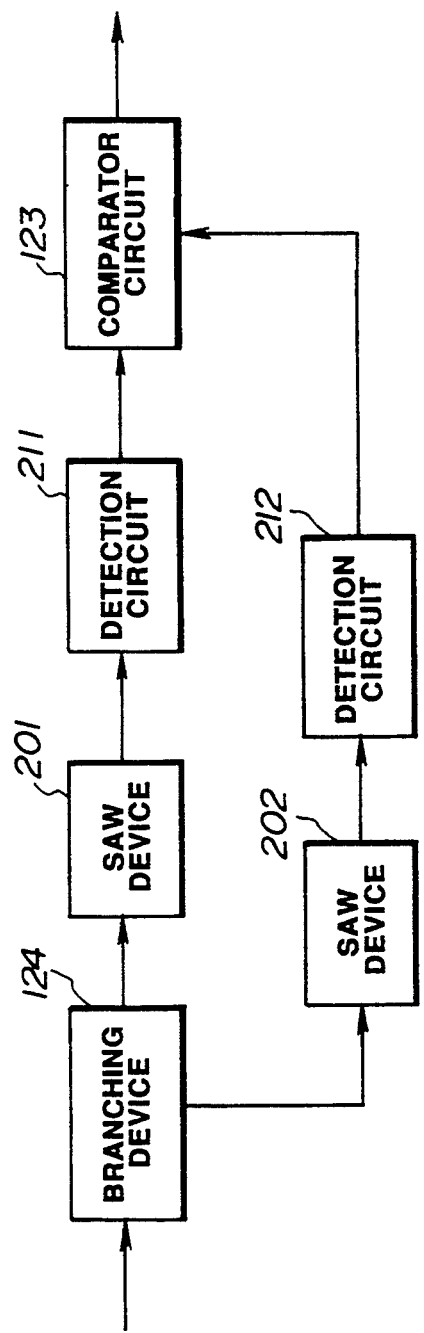

SURFACE ACOUSTIC WAVE DEVICE, AND DEMODULATING APPARATUS AND COMMUNICATION SYSTEM USING THE SURFACE ACOUSTIC WAVE DEVICE

This application is a continuation of application Ser. No. 08/055,347 filed May 3, 1993 now abandoned.

BACKGROUND OF THE INVENTION

1. Field of the Invention

The present invention relates to a surface acoustic wave device, and particularly to a surface acoustic wave (SAW) device usable for demodulation of data in a spread spectrum communication, and a demodulating circuit and a communication system using such a SAW device.

2. Related Background Art

The SAW is a wave which is propagated with its energy concentrated in the vicinity of a substrate surface, and its signal can be readily input or output through the substrate surface. Hence, the SAW device is noted as a signal processing device.

FIG. 1 illustrates a prior art SAW device. Its operation principle will be described with reference to FIG. 1. In FIG. 1, there are arranged, on a piezoelectric substrate 31, an input electrode 32 for exciting a SAW and an output electrode 33 for converting the SAW to an electric signal. The output electrode 33 is made up of a plurality of taps formed equidistantly on a SAW propagation path. Each tap consists of so-called a comb electrode, and comprises a pair or plural pairs of electrode digits. In the structure, when a signal is applied to the input electrode 32, a SAW corresponding to the signal is generated and propagated toward the output electrode 33. At the output electrode 33, the SAW reaches each tap at a constant interval. Therefore, an output is a time-sampled composite output. At each tap, a polarity can be altered by the arrangement of electrode digits. As a result, an output can be taken as a sum of values obtained by sampling the input signal at a constant interval and adding thereto the polarity of each tap. Therefore, a correlator operates by appropriately setting the polarity of each tap, and the output becomes maximum when the input signal coincides with the pattern of taps in the output electrode 33.

The SAW device can operate in the same manner even if the input and output electrodes are exchanged with each other, and in this case, the output becomes maximum when the input signal coincides with the tap pattern of the input electrode 32 of the SAW device.

FIG. 2 shows a prior art demodulator that uses the prior art SAW device illustrated in FIG. 1. In FIG. 2, a received signal is input into a prior art SAW device 20 through amplifier, filter, frequency changer and so forth. An output of the SAW device 20 is divided into two, and one of them is directly input into a multiplier 25 while the other one is input into the multiplier 25 through a delay circuit 26. If a signal modulated by a predetermined code series is received, a correlation peak appears as an output of the SAW device 20 when the modulated signal coincides with the tap pattern of the SAW device 20. Here, the tap pattern of the SAW device 20 coincides with a code series for one bit of the signal. Therefore, the correlation peak appears from the SAW device 20 for each one bit of the signal. Modulation information of the signal is stored in the correlation peak. Particularly, in the case of a phase modulation signal, phase modulation information is stored in a carrier wave of the correlation peak. The output of the SAW device is divided into two, and one of them is directly input into the multiplier 25 while the other one is input into the multiplier 25 after delayed by one bit of the signal. Thus, one-bit delayed detection is performed to demodulate the signal.

In the prior art SAW device as shown in FIG. 1, however, the tap pattern for one bit of the signal is only provided, and hence an external delay circuit and so forth are needed to compare adjacent bits with each other. Therefore, in the prior art demodulating circuit which uses such a prior art SAW device as shown in FIG. 2, loss in the delay circuit is large, and hence an amplifier needs to be inserted upstream and/or downstream of the delay circuit. Further, since a nonlinear clement such as a multiplier needs to be used, the size of an entire circuit is inevitably large. Moreover, quality of signal is lowered.

SUMMARY OF THE INVENTION

It is an object of the present invention to provide a surface acoustic wave device which needs no delay circuit to demodulate data so that the above-discussed problem is solved.

It is another object of the present invention to provide a demodulating apparatus or device which can reproduce data with a high signal quality by a simple circuit, and a communication system using the demodulating device.

According to one aspect of the SAW device of the present invention for achieving the above object, there arc arranged a piezoelectric substrate, an input electrode for generating a surface acoustic wave propagated in a predetermined direction, in accordance with an input signal, which is formed on the substrate, and an output electrode for converting the surface acoustic wave to an electric signal, which is also formed on the substrate. One of the input and output electrodes comprises a plurality of taps equidistantly arranged in a propagation direction of the surface acoustic wave, and satisfies an equation $L + \Delta l = 2V/A$ where $L$ is a length of one of the input and output electrodes in the propagation direction of the SAW, $\Delta l$ is a length of a space between the taps, $A$ is a transmission speed of the input signal and $V$ is a propagation velocity of the surface acoustic wave.

According to another aspect of the SAW device of the present invention for achieving the above object, there are arranged a piezoelectric substrate, an input electrode for generating a surface acoustic wave propagated in a predetermined direction, in accordance with an input signal, which is formed on the substrate, and an output electrode for converting the surface acoustic wave to an electric signal, which is also formed on the substrate. One of the input and output electrodes comprises first and second electrodes which are arranged along a direction perpendicular to a propagation direction of the surface acoustic wave, the first and second electrodes respectively comprise 2N taps (N is a natural number) which are equidistantly arranged in the propagation direction of the surface acoustic wave, the first electrode is structured so that a signal polarity corresponding to the tap, which is the i-th one ($i = 1, 2, \ldots, N$) counted from one side, is the same as a signal polarity corresponding to the $(N+i)$-th tap counted from the same side, the second electrode is structured so that a signal polarity corresponding to the tap, which is the i-th one (i=1, 2, ..., N) counted from one side, is opposite to a signal polarity corresponding to the (N+i)-th tap counted from the same side, and the first and second electrodes respectively satisfy an equation $L+\Delta l = 2V/A$ where L is a length of one of the first and second electrodes in the propagation direction, $\Delta l$ is a length of a space between the taps, A is a transmission speed of the input signal and V is a propagation velocity of the surface acoustic wave.

According to another aspect of the SAW device of the present invention for achieving the above object, there are arranged a piezoelectric substrate, an input electrode for generating a surface acoustic wave propagated in a predetermined direction, in accordance with an input signal, which is formed on the substrate, and an output electrode for converting the surface acoustic wave to an electric signal, which is also formed on the substrate. One of the input and output electrodes comprises a plurality of taps equidistantly arranged in a propagation direction of the surface acoustic wave, the other one of the input and output electrodes comprises first and second taps arranged at a predetermined distance in the propagation direction, and the other electrode satisfies an equation $D = nV/A$ where D is a distance between center lines of the first and second taps in the propagation direction, A is a transmission speed of the input signal, V is a propagation velocity of the surface acoustic wave and n is a positive integer.

According to another aspect of the SAW device of the present invention for achieving the above object, there are arranged a piezoelectric substrate, an input electrode for generating a surface acoustic wave propagated in a predetermined direction, in accordance with an input signal, which is formed on the substrate, and an output electrode for converting the surface acoustic wave to an electric signal, which is also formed on the substrate. One of the input and output electrodes comprises a plurality of taps equidistantly arranged in a propagation direction of the surface acoustic wave, the other one of the input and output electrodes comprises first and second electrodes arranged in a direction perpendicular to the propagation direction, the first electrode comprises first and second taps arranged at a predetermined distance in the propagation direction, the second electrode comprises third and fourth taps arranged at a predetermined distance in the propagation direction, and each of the first and second electrodes respectively satisfy an equation $D = nV/A$ where D is a distance between center lines of the first and second taps in the propagation direction, A is a transmission speed of the input signal, V is a propagation velocity of the surface acoustic wave and n is a positive integer.

According to one aspect of the demodulating device of the present invention for achieving the above object, there are arranged a surface acoustic wave device for supplying a correlation signal based on an input signal modulated in accordance with data, a detection circuit for envelope-detecting the correlation signal supplied from the surface acoustic wave device to supply an output, and a data judging circuit for judging the data based on the output from the detection circuit. The surface acoustic wave device comprises a piezoelectric substrate, an input electrode for generating a surface acoustic wave propagated in a predetermined direction, in accordance with an input signal, which is formed on the substrate, and an output electrode for receiving the surface acoustic wave and supplying the correlation signal, which is also formed on the substrate. One of the input and output electrodes comprises taps equidistantly arranged in a propagation direction of the surface acoustic wave, and satisfies an equation $L+\Delta l = 2V/A$ where L is a length of one of the input and output electrodes in the propagation direction, $\Delta l$ is a length of a space between the taps, A is a transmission speed of the input signal, and V is a propagation velocity of the surface acoustic wave.

According to another aspect of the demodulating device of the present invention for achieving the above object, there are arranged a surface acoustic wave device for supplying a correlation signal based on an input signal modulated in accordance with data, a detection circuit for envelope-detecting the correlation signal supplied from the surface acoustic wave device to supply an output, and a data judging circuit for judging the data based on the output from the detection circuit. The surface acoustic wave device comprises a piezoelectric substrate, an input electrode for generating a surface acoustic wave propagated in a predetermined direction, in accordance with an input signal, which is formed on the substrate, and an output electrode for receiving the surface acoustic wave and supplying the correlation signal, which is also formed on the substrate. One of the input and output electrodes comprises first and second electrodes which are arranged along a direction perpendicular to a propagation direction of the surface acoustic wave, the first and second electrodes respectively comprise a 2N number of taps (N is a natural number) which are equidistantly arranged in the propagation direction of the surface acoustic wave, the first electrode is structured so that a signal polarity corresponding to the tap, which is the i-th one (i=1, 2, ..., N) counted from one side, is the same as a signal polarity corresponding to the (N+i)-th tap counted from the same side, the second electrode is structured so that a signal polarity corresponding to the tap, which is the i-th one (i=1, 2, ..., N) counted from one side, is opposite to a signal polarity corresponding to the (N+i)-th tap counted from the same side, and the first and second electrodes respectively satisfy an equation $L+\Delta l = 2V/A$ where L is a length of each of the first and second electrodes in the propagation direction, $\Delta l$ is a length of a space between the taps, A is a transmission speed of the input signal and V is a propagation velocity of the surface acoustic wave.

According to another aspect of the demodulating device of the present invention for achieving the above object, there are arranged a branching device for dividing a signal modulated in accordance with data into first and second input signals, a first surface acoustic wave device for supplying a first correlation signal based on the first input signal divided by the branching device, a second surface acoustic wave device for supplying a second correlation signal based on the second input signal divided by the branching device, a first detection circuit for envelope-detecting the first correlation signal supplied from the first surface acoustic wave device to supply an output, and a second detection circuit for envelope-detecting the second correlation signal supplied from the second surface acoustic wave device to supply an output, and a comparator circuit for comparing the outputs supplied from the first and second detection circuits.

The first surface acoustic wave device comprises a piezoelectric substrate, an input electrode for generating a surface acoustic wave propagated in a predetermined direction, in accordance with the input signal, which is formed on the substrate, and an output electrode for receiving the surface acoustic wave and supplying the correlation signal, which is also formed on the substrate. One of the input and output electrodes comprises a plurality of taps equidistantly arranged in a propagation direction of the surface acoustic wave, is structured so that a signal polarity corresponding to the tap, which is the i-th one (i = 1, 2, ..., N) counted from one side, is the same as a signal polarity corresponding to the (N+i)-th tap counted from the same side, and satisfies an equation $L + \Delta l = 2V/A$ where L is a length of one of the input and output electrodes in the propagation direction, $\Delta l$ is a length of a space between the taps, A is a transmission speed of the input signal and V is a propagation velocity of the surface acoustic wave.

The second surface acoustic wave device comprises a piezoelectric substrate, an input electrode for generating a surface acoustic wave propagated in a predetermined direction, in accordance with the input signal, which is formed on the substrate, and an output electrode for receiving the surface acoustic wave and supplying the correlation signal, which is also formed on the substrate. One of the input and output electrodes comprises a plurality of taps equidistantly arranged in a propagation direction of the surface acoustic wave, is structured so that a signal polarity corresponding to the tap, which is the i-th one (i = 1, 2, ..., N) counted from one side, is opposite to a signal polarity corresponding to the (N+i)-th tap counted from the same side, and satisfies an equation $L + \Delta l = 2V/A$ where L is a length of one of the input and output electrodes in the propagation direction, $\Delta l$ is a length of a space between the taps, A is a transmission speed of the input signal and V is a propagation velocity of the surface acoustic wave.

According to another aspect of the demodulating device of the present invention for achieving the above object, there are arranged a surface acoustic wave device for supplying a correlation signal based on an input signal modulated in accordance with data, a detection circuit for envelope-detecting the correlation signal supplied from the surface acoustic wave device to supply an output, and a data judging circuit for judging the data based on the output from the detection circuit.

The surface acoustic wave device comprises a piezoelectric substrate, an input electrode for generating a surface acoustic wave propagated in a predetermined direction, in accordance with an input signal, which is formed on the substrate, and an output electrode for receiving the surface acoustic wave and supplying the correlation signal, which is also formed on the substrate. One of the input and output electrodes comprises a plurality of taps equidistantly arranged in a propagation direction of the surface acoustic wave, the other one of the input and output electrodes comprises first and second taps arranged at a predetermined distance in the propagation direction, and the other electrode satisfies an equation $D = nV/A$ where D is a distance between center lines of the first and second taps in the propagation direction, A is a transmission speed of the input signal, V is a propagation velocity of the surface acoustic wave and n is a positive integer.

According to another aspect of the demodulating device of the present invention for achieving the above object, there are arranged a surface acoustic wave device for supplying a correlation signal based on an input signal modulated in accordance with data, a detection circuit for envelope-detecting the correlation signal supplied from the surface acoustic wave device to supply an output, and a data judging circuit for judging the data based on the output from the detection circuit.

The surface acoustic wave device comprises a piezoelectric substrate, an input electrode for generating a surface acoustic wave propagated in a predetermined direction, in accordance with an input signal, which is formed on the substrate, and an output electrode for receiving the surface acoustic wave and supplying the correlation signal, which is also formed on the substrate. One of the input and output electrodes comprises a plurality of taps equidistantly arranged in a propagation direction of the surface acoustic wave, the other one of the input and output electrodes comprises first and second electrodes arranged in a direction perpendicular to the propagation direction, the first electrode comprises first and second taps arranged at a predetermined distance in the propagation direction, the second electrode comprises third and fourth taps arranged at a predetermined distance in the propagation direction, and the first and second electordes respectively satisfy an equation $D = nV/A$ where D is each of distances between center lines of the first and second taps and between the third and fourth taps in the propagation direction, A is a transmission speed of the input signal, V is a propagation velocity of the surface acoustic wave and n is a positive integer.

According to another aspect of the demodulating device of the present invention for achieving the above object, there are arranged a branching device for dividing a signal modulated in accordance with data into first and second input signals, a first surface acoustic wave device for supplying a first correlation signal based on the first input signal divided by the branching device, a second surface acoustic wave device for supplying a second correlation signal based on the second input signal divided by the branching device, a first detection circuit for envelope-detecting the first correlation signal supplied from the first surface acoustic wave device to supply an output, and a second detection circuit for envelope-detecting the second correlation signal supplied from the second surface acoustic wave device to supply an output, and a comparator circuit for comparing the outputs supplied from the first and second detection circuits.

The first surface acoustic wave device comprises a piezoelectric substrate, an input electrode for generating a surface acoustic wave propagated in a predetermined direction, in accordance with the input signal, which is formed on the substrate, and an output electrode for converting the surface acoustic wave to an electric signal, which is also formed on the substrate.

One of the input and output electrodes comprises a plurality of taps equidistantly arranged in a propagation direction of the surface acoustic wave, the other electrode comprises first and second taps arranged at a predetermined distance in the propagation direction, a signal polarity corresponding to the first tap is the same as a signal polarity corresponding to the second tap, and the other electrode satisfies an equation $D = nV/A$ where D is a distance between center lines of the first and second taps in the propagation direction, A is a transmission speed of the input signal, V is a propagation velocity of the surface acoustic wave, and n is a positive integer.

The second surface acoustic wave device comprises a piezoelectric substrate, an input electrode for generating a surface acoustic wave propagated in a predetermined direction, in accordance with the input signal, which is formed on the substrate, and an output electrode for converting the surface acoustic wave to an electric signal, which is also formed on the substrate.

One of the input and output electrodes comprises a plurality of taps equidistantly arranged in a propagation direction of the surface acoustic wave, the other electrode comprises third and fourth taps arranged at a predetermined distance in the propagation direction, a signal polarity corresponding to the third tap is opposite to a signal polarity corresponding to the fourth tap, and the other electrode satisfies an equation D=nV/A where D is a distance between center lines of the third and fourth taps in the propagation direction, A is a transmission speed of the input signal, V is a propagation velocity of the surface acoustic wave, and n is a positive integer.

According to one aspect of the communication system of the present invention for achieving the above object, there are arranged a transmitter for transmitting a signal modulated in accordance with data, a receiver circuit for receiving the signal transmitted from the transmitter, a surface acoustic wave device for supplying a correlation signal based on the signal received by the receiver circuit, a detection circuit for envelope-detecting the correlation signal supplied from the surface acoustic wave device to supply an output, and a data judging circuit for judging the data based on the output from the detection circuit.

The surface acoustic wave device comprises a piezoelectric substrate, an input electrode for generating a surface acoustic wave propagated in a predetermined direction, in accordance with the received signal, which is formed on the substrate, and an output electrode for receiving the surface acoustic wave and supplying the correlation signal, which is also formed on the substrate. One of the input and output electrodes comprises a plurality of taps equidistantly arranged in a propagation direction of the surface acoustic wave, and satisfies an equation $L+\Delta l=2V/A$ where L is a length of one of the input and output electrodes in the propagation direction, $\Delta l$ is a length of a space between the taps, A is a transmission speed of the input signal and V is a propagation velocity of the surface acoustic wave.

According to another aspect of the communication system of the present invention for achieving the above object, there are arranged a transmitter for transmitting a signal modulated in accordance with data, a receiver circuit for receiving the signal transmitted from the transmitter, a surface acoustic wave device for supplying a correlation signal based on the signal received by the receiver circuit, a detection circuit for envelope-detecting the correlation signal supplied from the surface acoustic wave device to supply an output, and a data judging circuit for judging the data based on the output from the detection circuit.

The surface acoustic wave device comprises a piezoelectric substrate, an input electrode for generating a surface acoustic wave propagated in a predetermined direction, in accordance with the received signal, which is formed on the substrate, and an output electrode for receiving the surface acoustic wave and supplying the correlation signal, which is also formed on the substrate. One of the input and output electrodes comprises first and second electrodes which are arranged along a direction perpendicular to a propagation direction of the surface acoustic wave, the first and second electrodes respectively comprise a 2N number of taps (N is a natural number) which are equidistantly arranged in the propagation direction of the surface acoustic wave, the first electrode is structured so that a signal polarity corresponding to the tap, which is the i-th one (i=1, 2, ..., N) counted from one side, is the same as a signal polarity corresponding to the (N+i)-th tap counted from the same side, the second electrode is structured so that a signal polarity corresponding to the tap, which is the i-th one (i=1, 2, ..., N) counted from one side, is opposite to a signal polarity corresponding to the (N+i)-th tap counted from the same side, and the first and second electrodes respectively satisfy an equation $L+\Delta l=2V/A$ where L is a length of each of the first and second electrodes in the propagation direction, $\Delta l$ is a length of a space between the taps, A is a transmission speed of the input signal and V is a propagation velocity of the surface acoustic wave.

According to another aspect of the communication system of the present invention for achieving the above object, there are arranged a transmitter for transmitting a signal modulated in accordance with data, a receiver circuit for receiving the signal transmitted from the transmitter, a branching device for dividing the signal received by the receiver circuit into first and second input signals, a first surface acoustic wave device for supplying a first correlation signal based on the first input signal divided by the branching device, a second surface acoustic wave device for supplying a second correlation signal based on the second input signal divided by the branching device, a first detection circuit for envelope-detecting the first correlation signal supplied from the first surface acoustic wave device to supply an output, a second detection circuit for envelope-detecting the second correlation signal supplied from the second surface acoustic wave device to supply an output, and a comparator for comparing the outputs from the first and second detection circuits.

The first surface acoustic wave device comprises a piezoelectric substrate, an input electrode for generating a surface acoustic wave propagated in a predetermined direction, in accordance with the input signal, which is formed on the substrate, and an output electrode for receiving the surface acoustic wave and supplying the correlation signal, which is also fromed on the substrate. One of the input and output electrodes comprises a 2N number of taps (n is a natural number) equidistantly arranged in a propagation direction of the surface acoustic wave, is structured so that a signal polarity corresponding to the tap, which is the i-th one (i=1, 2, ..., N) counted from one side, is the same as a signal polarity corresponding to the (N+i)-th tap counted from the same side, and satisfies an equation $L+\Delta l=2V/A$ where L is a length of one of the input and output electrodes in the propagation direction, $\Delta l$ is a length of a space between the taps, A is a transmission speed of the input signal and V is a propagation velocity of the surface acoustic wave.

The second surface acoustic wave device comprises a piezoelectric substrate, an input electrode for generating a surface acoustic wave propagated in a predetermined direction, in accordance with the input signal, which is formed on the substrate, and an output electrode for receiving the surface acoustic wave and supplying the correlation signal, which is also fromed on the substrate. One of the input and output electrodes comprises a 2N number of taps (n is a natural number) equidistantly arranged in a propagation direction of the surface acoustic wave, is structured so that a signal polarity corresponding to the tap, which is the i-th one ($i=1, 2, \ldots, N$) counted from one side, is opposite to a signal polarity corresponding to the (N+i)-th tap counted from the same side, and satisfies an equation $L+\Delta l=2V/A$ where L is a length of one of the input and output electrodes in the propagation direction, $\Delta l$ is a length of a space between the taps, A is a transmission speed of the input signal and V is a propagation velocity of the surface acoustic wave.

According to another aspect of the communication system of the present invention for achieving the above object, there are arranged a transmitter for transmitting a signal modulated in accordance with data, a receiver circuit for receiving the signal transmitted from the transmitter, a surface acoustic wave device for supplying a correlation signal based on the signal received by the receiver circuit, a detection circuit for envelope-detecting the correlation signal supplied from the surface acoustic wave device to supply an output, and a data judging circuit for judging the data based on the output from the detection circuit.

The surface acoustic wave device comprises a piezoelectric substrate, an input electrode for generating a surface acoustic wave propagated in a predetermined direction, in accordance with the input signal, which is formed on the substrate, and an output electrode for receiving the surface acoustic wave and supplying the correlation signal, which is formed on the substrate. One of the input and output electrodes comprises a plurality of taps equidistantly arranged in a propagation direction of the surface acoustic wave, the other one of the input and output electrodes comprises first and second taps arranged at a predetermined distance in the propagation direction, and the other electrode satisfies an equation $D=nV/A$ where D is a distance between center lines of the first and second taps in the propagation direction, A is a transmission speed of the input signal, V is a propagation velocity of the surface acoustic wave and n is a positive integer.

According to another aspect of the communication system of the present invention for achieving the above object, there are arranged a transmitter for transmitting a signal modulated in accordance with data, a receiver circuit for receiving the signal transmitted from the transmitter, a surface acoustic wave device for supplying a correlation signal based on the signal received by the receiver circuit, a detection circuit for envelope-detecting the correlation signal supplied from the surface acoustic wave device to supply an output, and a data judging circuit for judging the data based on the output from the detection circuit.

The surface acoustic wave device comprises a piezoelectric substrate, an input electrode for generating a surface acoustic wave propagated in a predetermined direction, in accordance with the input signal, which is formed on the substrate, and an output electrode for receiving the surface acoustic wave and supplying the correlation signal, which is formed on the substrate. One of the input and output electrodes comprises a plurality of taps equidistantly arranged in a propagation direction of the surface acoustic wave, the other one of the input and output electrodes comprises first and second electrodes arranged in a direction perpendicular to the propagation direction, the first electrode comprises first and second taps arranged at a predetermined distance in the propagation direction, the second electrode comprises third and fourth taps arranged at a predetermined distance in the propagation diraction, and the first and second electrodes respectively satisfy an equation $D=nV/A$ where D is each of distances between center lines of the first and second taps and between center lines of the third and fourth taps in the propagation direction, A is a transmission speed of the input signal, V is a propagation velocity of the surface acoustic wave and n is a positive integer.

According to another aspect of the communication system of the present invention for achieving the above object, there are arranged a transmitter for transmitting a signal modulated in accordance with data, a receiver circuit for receiving the signal transmitted from the transmitter, a branching device for dividing the signal received by the receiver circuit into first and second input signals, a first surface acoustic wave device for supplying a first correlation signal based on the first input signal divided by the branching device, a second surface acoustic wave device for supplying a second correlation signal based on the second input signal divided by the branching device, a first detection circuit for envelope-detecting the first correlation signal supplied from the first surface acoustic wave device to supply an output, a second detection circuit for envelope-detecting the second correlation signal supplied from the second surface acoustic wave device to supply an output, and a comparator circuit for comparing the outputs supplied from the first and second detection circuits.

The first surface acoustic wave device comprises a piezoelectric substrate, an input electrode for generating a surface acoustic wave propagated in a predetermined direction, in accordance with the input signal, which is formed on the substrate, and an output electrode for converting the surface acoustic wave to an electric signal, which is also formed on the substrate.

One of the input and output electrodes comprises a plurality of taps equidistantly arranged in a propagation direction of the surface acoustic wave, the other one of the input and output electrodes comprises first and second taps arranged at a predetermined distance in the propagation direction, a signal polarity corresponding to the first tap is the same as a signal polarity corresponding to the second tap, and the other electrode satisfies an equation $D=nV/A$ where D is a distance between center lines of the first and second taps in the propagation direction, A is a transmission speed of the input signal, V is a propagation velocity of the surface acoustic wave and n is a positive integer.

The second surface acoustic wave device comprises a piezoelectric substrate, an input electrode for generating a surface acoustic wave propagated in a predetermined direction, in accordance with the input signal, which is formed on the substrate, and an output electrode for converting the surface acoustic wave to an electric signal, which is also formed on the substrate.

One of the input and output electrodes comprises a plurality of taps equidistantly arranged in a propagation direction of the surface acoustic wave, the other one of the input and output electrodes comprises third and fourth taps arranged at a predetermined distance in the propagation direction, a signal polarity corresponding to the third tap is opposite to a signal polarity corresponding to the fourth tap, and the other electrode satisfies an equation $D=nV/A$ where D is a distance between center lines of the third and fourth taps in the propagation direction, A is a transmission speed of the input signal, V is a propagation velocity of the surface acoustic wave and n is a positive integer.

In the specification, the wording "signal polarities corresponding to two taps are the same" signifies the following fact: When those taps constitute an input electrode, phases of surface acoustic waves generated by the respective taps for a common input signal are equal to each other, i.e., the phases are the same. Further, when those taps constitute an output electrode, phases of signals output by those taps when a common surface acoustic wave is received thereby are equal to each other, i.e., the phases are the same.

On the other hand, the wording "signal polarities corresponding to two taps are opposite to each other" signifies the following fact: When those taps constitute an input electrode, phases of surface acoustic waves generated by the respective taps for a common input signal are different from each other by 180°, i.e., the phases are opposite to each other. Further, when those taps constitute an output electrode, phases of signals output by those taps when a common surface acoustic wave is received thereby are different from each other by 180°, i.e., the phases are opposite to each other.

According to a SAW device of the present invention, signal processing of two consecutive bits of signal can be performed, while signal processing of only one bit of signal could be conventionally performed.

Therefore, when the SAW of the present invention is used in a demodulator, it can be readily judged if two consecutive data have the same code (or sign) or different code (or sign), by detecting the output level of the SAW device. As a result, a delay circuit and a multiplier, which are needed in a prior art demodulating circuit, can be omitted, so that the circuit size can be reduced and that degradation of signal quality can be prevented.

These advantages and others will be more readily understood in connection with the following detailed description of the preferred embodiments in conjunction with the drawings.

BRIEF DESCRIPTION OF THE DRAWINGS

FIG. 10 is a block diagram showing a first embodiment of a demodulating apparatus of a present invention which uses a SAW device shown in any one of FIGS. 3 through 8.

FIG. 11 is a block diagram showing a second embodiment of a demodulating apparatus of a present invention which uses a SAW device shown in any one of FIGS. 3 through 8.

DESCRIPTION OF THE PREFERRED EMBODIMENT

First Embodiment

Figure 1:
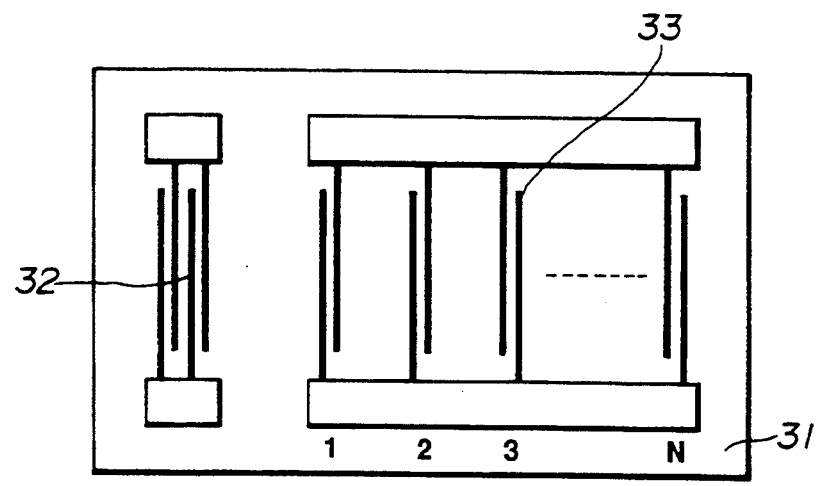
FIG. 1 is a schematic plan view showing an example of a prior art SAW device.
Figure 2:
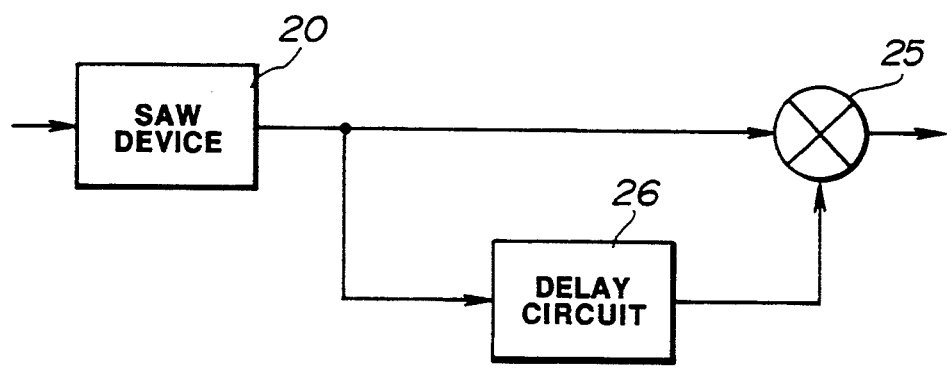
FIG. 2 is a block diagram showing an example of a prior art demodulating circuit which uses the SAW device shown in FIG. 1.
Figure 3:
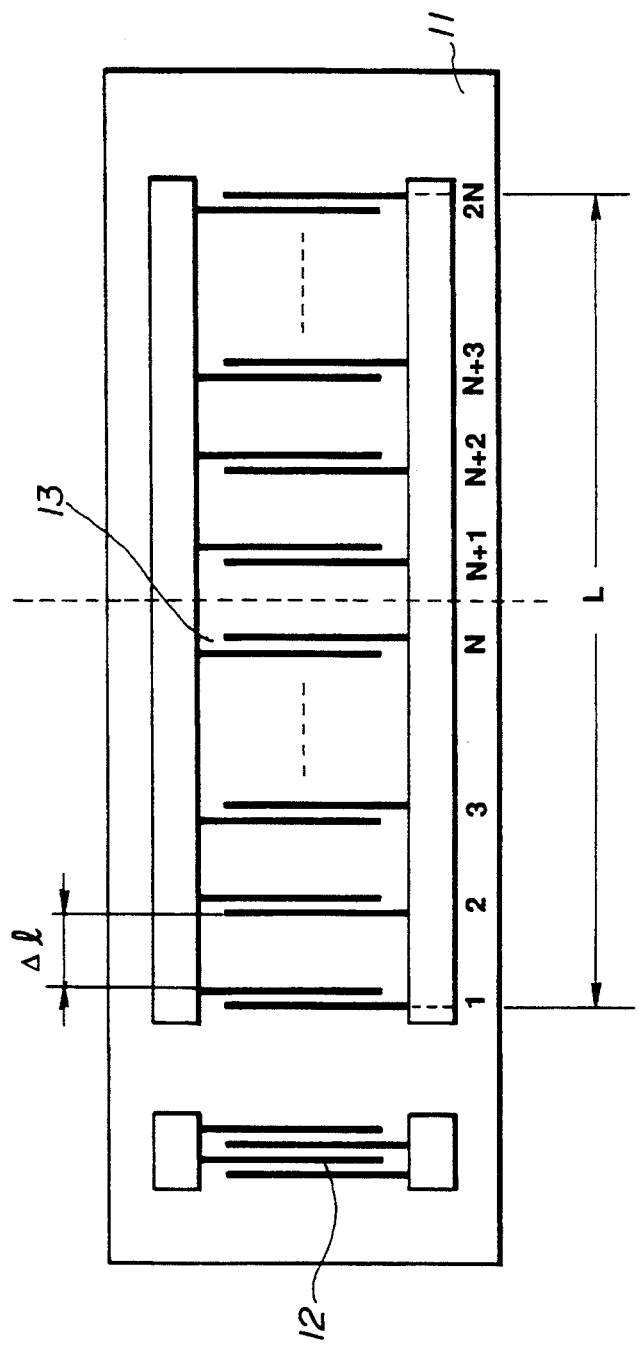
FIG. 3 is a schematic plan view showing a first embodiment of a SAW device according to the present invention.

A first embodiment of a SAW device according to the present invention will be described with reference to FIG. 3 which is a schematic plan view of the device. In FIG. 3, reference numeral 11 designates a piezoelectric substrate. Crystal, lithium niobate and so forth, for example, may be used as the piezoelectric substrate 11.

Reference numeral 12 designates an input electrode arranged on the surface of the substrate 11. The input electrode 12 is a comb electrode, and is made up of conductive material such as aluminum, silver and gold.

Reference numeral 13 designates an output electrode arranged opposite to the input electrode 12 on the surface of the substrate 11. The output electrode 13 is a comb electrode, and is formed with conductive material such as aluminum, silver and gold. The output electrode 13 is composed of 2N taps which are equidistantly arranged on a surface acoustic wave propagation path.

The feature of the SAW device of the present invention is that the length L [m] of the output electrode 13 in a direction of SAW propagation substantially satisfies an equation:

$$L + \Delta l = 2V/A \tag{1}$$

where A [bit/sec.] is a transmission speed of an input signal input into the input electrode 12, V [m/sec.] is a propagation velocity of the SAW and $\Delta l$ [m] is a length of a space between the taps.

In the prior art device, $L \approx V/A$ is satisfied and thus the device is structured so that a signal process of one bit of signal is performed. In the present invention, however, the device is structured so that a signal process of two bits can be performed at a time. For this purpose, the equation (1) has been derived. Therefore, a SAW device, which can process two consecutive bits of signal at a time, can be obtained by causing the structure to satisfy the equation (1).

Further, a half series of taps (1~N) closer to the input electrode 12 have the same polarities as those of the other half series of taps (N+1~2N) remote from the electrode 12. In other words, the taps 1, 2, 3, ..., and N respectively have the same polarities as those of the taps N+1, N+2, N+3, ..., 2N.

The operation of the first embodiment will be described hereinbelow.

When a signal is applied to the input electrode 12, a surface acoustic wave is excited and propagated toward the output electrode 13. Since the output electrode 13 has a length of two bits of signal, one bit of signal is input into each of the two series of taps 1~N and taps N+1~2N. A signal, which is earlier than that input into the taps 1~N by one bit, is input into the taps N+1~2N. Therefore, when one bit of signal coincides with the taps 1~N and a correlation peak appears at the side of the taps 1~N, a signal, which is one bit earlier, coincides with the taps N+1~2N and a correlation peak appears thereat. At this time, if a phase of the signal input into the taps 1~N is the same as that of the signal input into the taps N+1~2N, the respective correlation peaks are overlapped with the same phase and thus a large correlation peak can be obtained. On the other hand, if the two signals have the opposite phases to each other, the correlation peaks appearing at the taps 1~N and the taps N+1~2N have the opposite phases and hence they are cancelled by each other.

Thus, when two consecutive bits of signal, which are input into the SAW device of the first embodiment, have the same phase, a large correlation peak appears, while no correlation peak can be obtained in the case of the opposite phase. As a result, data can be readily demodulated by merely detecting the output level of the SAW device.

Especially, when a signal is a differential phase-shifted keyed signal, the magnitude of the output level of the SAW device corresponds to [1] or [0] of data, as it is, and hence data can be far more readily demodulated.

Second Embodiment

A second embodiment of a SAW device according to the present invention will be described with reference to FIG. 4 which is a schematic plan view of the device. In FIG. 3, the same members or elements as those in FIG. 3 are designated by the same reference numerals, and a detailed explanation thereof will be omitted.

The second embodiment differs from the first embodiment only in that a half series of taps 1~N of the output electrode 14 closer to the input electrode 12 have polarities opposite to those of the other half series of taps N+1~2N remote from the input electrode 12, i.e., that the taps 1~N respectively have polarities opposite to those of the taps N+1~2N.

The same operation and advantage as those of the first embodiment can also be obtained in the second embodiment. In the second embodiment, however, since the polarities of the taps 1~2N are set as described above, a large correlation peak appears in the output of the SAW device when two consecutive bits of signal, input into the SAW device of the second embodiment, have phases opposite to each other, while the output is cancelled in the case of the same phase.

Third Embodiment

A third embodiment of a SAW device according to the present invention will be described with reference to FIG. 5 which is a schematic plan view of the device. In FIG. 5, the same members or elements as those in FIGS. 3 and 4 are designated by the same reference numerals, and a detailed explanation thereof will be omitted.

In the third embodiment, the SAW device of the first embodiment and the SAW device of the second embodiment are arranged on a common substrate 11, and an input electrode 12 is common to the two SAW devices. In other words, in the third embodiment, an output electrode 13 having the same polarities and an output electrode 14 having the opposite polarities are formed on the common substrate 11.

In the third embodiment, since the two SAW devices are formed on the common substrate 11, the function of the device can be multiplied, and an entire size of the device can be reduced when two devices are used.

Although the input electrode 12 is common to the two SAW devices in the third embodiment, separate input electrodes may be formed for the two devices with the same operation and advantage.

In the above-discussed first to third embodiments, the same effect or advantage can be obtained even if the input electrode 12 and the output electrodes 13 and 14 are replaced by each other, i.e., by setting the electrodes 13 and 14 and the electrode 12 as input and output electrodes, respectively.

Further, in the first to third embodiments, the input electrode 12 and the output electrodes 13 and 14 can be respectively structured as double or strip electrodes so that the reflection of the SAW at the input electrode 12 and the output electrodes 13 and 14 may be reduced.

Moreover, in the first to third embodiments, the material of the piezoelectric substrate 11 is not limited to piezoelectric single crystal such as crystal, and lithium niobate, but structures formed by applying piezoelectric films onto semiconductor and glass substrate may be used.

In the above-discussed embodiments, one of input and output electrodes is made up of 2N taps, but one of input and output electrodes may be composed of N taps and the other electrode may be made up of first and second taps which are arranged apart from each other by a predetermined distance in a SAW propagation direction. The same advantage as that of the first to third embodiments can also be obtained by the latter structure. Such embodiments will be described hereinbelow.

Fourth Embodiment

Figure 6:
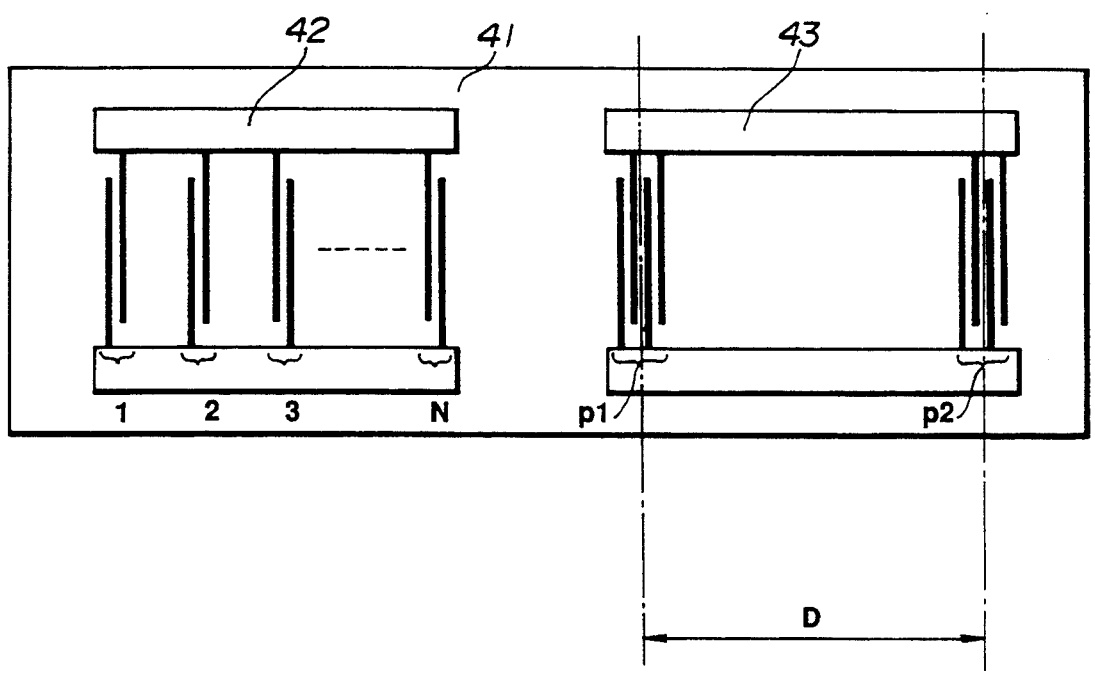
FIG. 6 is a schematic plan view showing a fourth embodiment of a SAW device according to the present invention.

A fourth embodiment of a SAW device according to the present invention will be described with reference to FIG. 6 which is a schematic plan view of the device. In FIG. 6, reference numeral 41 designates a piezoelectric substrate. Piezoelectric material such as crystal and lithium niobate may be used as the piezoelectric substrate 41.

Reference numeral 42 designates an input electrode arranged on the surface of the substrate 41. The input electrode 42 is a comb electrode, and is made up of conductive material such as aluminum, silver and gold. The input electrode 42 is composed of N taps which are equidistantly arranged on a SAW propagation path.

Reference numeral 43 designates an output electrode arranged opposite to the input electrode 42 on the surface of the substrate 41. The output electrode 43 is a comb electrode, and is formed with conductive material such as aluminum, silver and gold. The output electrode 43 is composed of two taps p1 and p2 which are arranged at a predetermined distance from each other on the SAW propagation path.

The feature of the SAW device of this embodiment is that a distance D [m] between center lines of the taps substantially satisfies an equation $D=V/A$, where A [bit/sec.] is a transmission speed of an input signal input into the input electrode 42, V [m/sec.] is a propagation velocity of the SAW. The shapes of the taps p1 and p2 are identical to each other, and their polarities are the same. Therefore, a unmodulated SAW is taken out from the two taps with the same phase.

The operation of the fourth embodiment will be described hereinbelow.

When a signal is applied to the input electrode 42, a surface acoustic wave is excited and propagated toward the output electrode 43. Here, the input electrode 42 has N, and its entire length is equal to a value for one bit of signal. The SAWs generated at the respective taps of the input electrode 42 are superposed and propagated toward the output electrode 43. When one bit of signal coincides with the taps 1~N, the superposed SAW are propagated as a correlation peak signal. The SAW is converted to an electric signal at the respective taps of the output electrode 43, and is taken out as a composite form. Since the distance D between the center lines of the two taps substantially satisfies the equation $D=V/A$, the output from the tap p2 is a signal which is 1/A [sec.] or one bit earlier than the output from the tap p1 near the input electrode 42. The output from the output electrode 43 is a composite or combined one between the output from the tap p1 and the output from the tap p2. As a result, the outputs are added when the phase of the output from the tap p1 is the same as that from the tap p2, while the outputs are cancelled in the case of the opposite phase.

Thus, when two consecutive bits of signal, which are input into the SAW device of the this embodiment, have the same phase, a large correlation peak appears, while no correlation peak can be obtained in the case of the opposite phase. As a result, data can be readily demodulated by merely detecting the output level of the SAW device.

Especially, when a signal is a differential phase-shifted keyed signal, the magnitude of the output level of the SAW device corresponds to [1] or [2] of data, as it is, and hence data can be far more readily demodulated.

Further, if the distance D between the two taps satisfies an equation $D=nV/A$ (n is a positive integer), n-bit delay detection can be performed.

Fifth Embodiment

Figure 7:
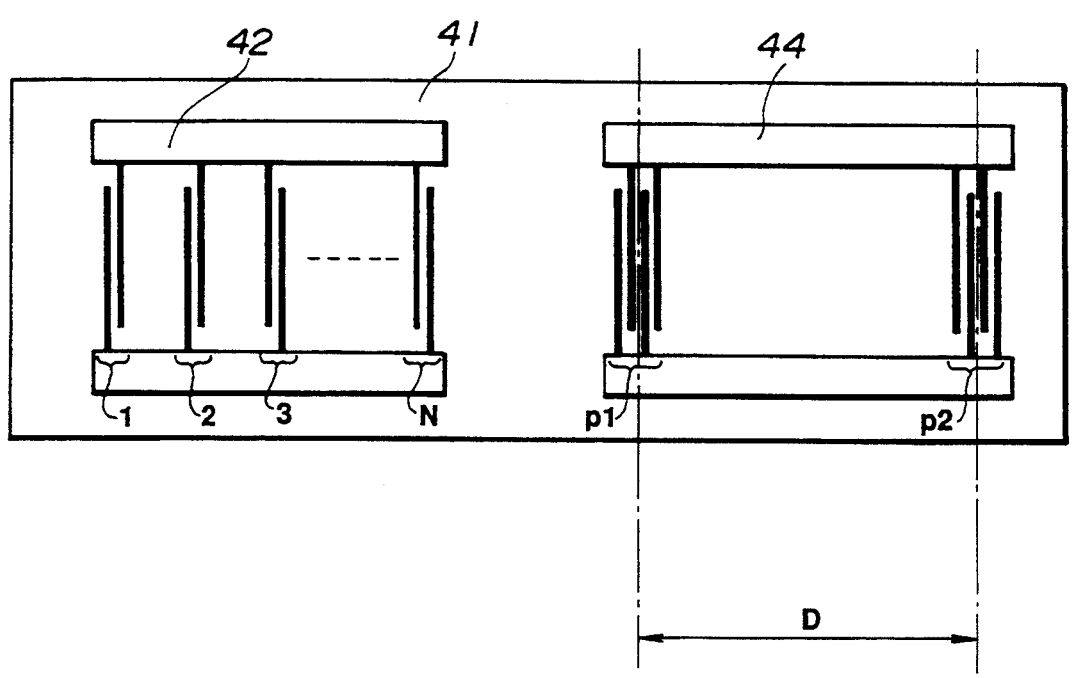
FIG. 7 is a schematic plan view showing a fifth embodiment of a SAW device according to the present invention.

A fifth embodiment of a SAW device according to the present invention will be described with reference to FIG. 7 which is a schematic plan view of the device. In FIG. 7, the same members or elements as those in FIG. 6 are designated by the same reference numerals, and a detailed explanation thereof will be omitted.

In the fifth embodiment, shapes of two taps p1 and p2 of an output electrode 44 are different from each other, and their polarities are opposite to each other. Therefore, the fifth embodiment differs from the fourth embodiment only in that an unmodulated SAW signal is taken out as a signal having an opposite phase.

The fifth embodiment has the same operation and advantage as those of the fourth embodiment. In the fifth embodiment, however, a large correlation peak appears as an output when two consecutive bits of a signal input into the SAW device have opposite phases to each other, while the outputs are cancelled when the phases are the same.

Sixth Embodiment

Figure 8:
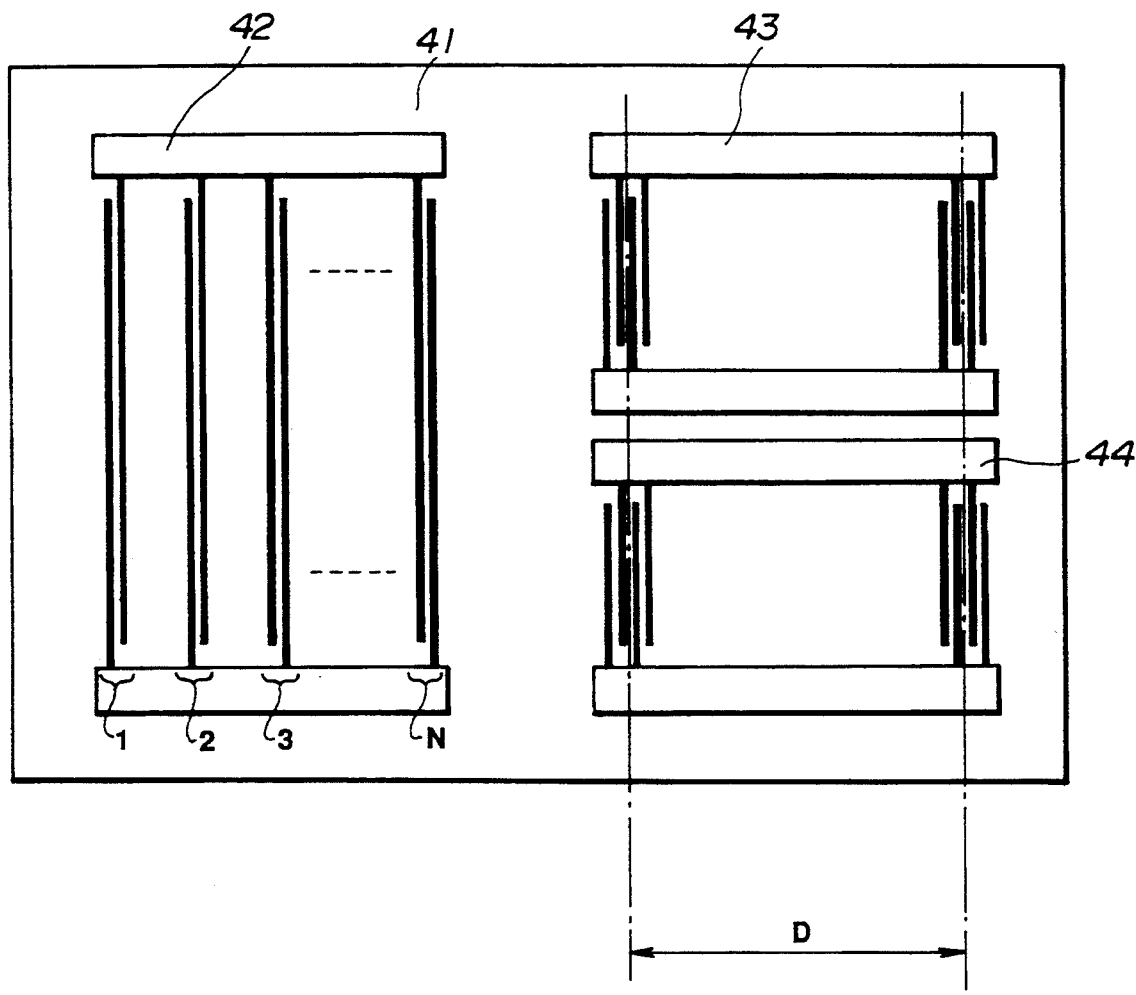
FIG. 8 is a schematic plan view showing a sixth embodiment of a SAW device according to the present invention.

A sixth embodiment of a SAW device according to the present invention will be described with reference to FIG. 8 which is a schematic plan view of the device. In FIG. 8, the same members or elements as those in FIGS. 6 and 7 are designated by the same reference numerals, and a detailed explanation thereof will be omitted.

In the sixth embodiment, the SAW device of the fourth embodiment and the SAW device of the fifth embodiment are arranged on a common substrate 41, and an input electrode 42 is common to the two SAW devices. In other words, in the sixth embodiment, an output electrode 43 having the same polarities (i.e., signal polarities corresponding to two taps are the same) and an output electrode 44 having the opposite polarities (i.e., signal polarities corresponding to two taps are opposite to each other) are formed on the common substrate 41.

In the sixth embodiment, since the two SAW devices are formed on the common substrate 41, the function of the device can be multiplied, and an entire size of the device can be reduced when two devices are used.

Although the input electrode 42 is common to the two SAW devices in the sixth embodiment, separate input electrodes may be formed for the two devices with the same operation and advantage.

In the above-discussed fourth to sixth embodiments, the same effect or advantage can be obtained even if the input electrode 42 and the output electrodes 43 and 44 are replaced by each other, i.e., by setting the electrodes 43 and 44 and the electrode 42 as input and output electrodes, respectively.

Further, in the fourth to sixth embodiments, the input electrode 42 and the output electrodes 43 and 44 can be respectively structured as double or strip electrodes so that the reflection of the SAW at the input electrode 42 and the output electrodes 43 and 44 can be reduced.

Moreover, in the fourth to sixth embodiments, the material of the piezoelectric substrate 41 is not limited to piezoelectric crystal such as crystal and lithium niobate, but a structure formed by applying a piezoelectric film onto a semiconductor or a glass substrate may be used.

Other Embodiments

Figure 9:
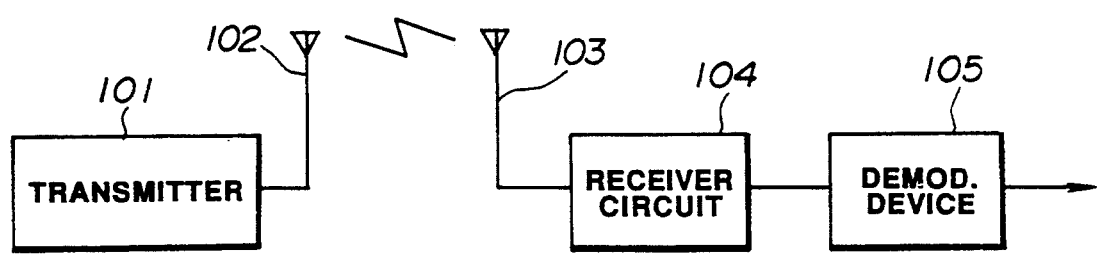
FIG. 9 is a block diagram showing a first embodiment of a communication system of a present invention which uses a SAW device shown in any one of FIGS. 3 through 8.

FIG. 9 is a block diagram showing an embodiment of a communication system according to the present invention, which uses any one of the SAW devices shown in FIGS. 3 to 8. In FIG. 9, a signal to be transmitted is spectrum-spread in a transmitter 101, and this signal is transmitted through an antenna 102 of the transmitter 101. The transmitted signal is received by a receiver circuit 104 through an antenna 103. The received signal is input into a demodulating device 105 which includes any one of the SAW devices of FIGS. 3 to 8, and data is demodulated.

FIG. 10 is a block diagram showing an embodiment of the demodulating device. In FIG. 10, reference numeral 120 designates any one of the SAW devices shown in FIGS. 3 to 8. Reference numeral 121 designates a detection circuit for envelope-detecting the output of the SAW device 120. Reference numeral 122 designates a data judging circuit for identifying [1] or [0] of data based on the output from the detection circuit 121. In FIG. 10, amplifier, filter and so forth are omitted for simplicity, but they may be inserted in front and/or rear stage of the respective circuits when necessary.

The operation of this embodiment will be described. The received signal is input into the SAW device 120 through amplifier, filter, frequency changer circuit and so forth. The SAW device 120 is a SAW device according to the present invention. The SAW device 120 is, for example, a SAW device of FIG. 3 in which taps of the output electrode arranged in a half region closer to the input electrode is composed of the same series of taps as that of taps arranged in the other half region remote from the input electrode. The input and output electrodes of the SAW device may be replaced by each other.

The received signal is a signal which is obtained by modulating a phase-modulated signal in accordance with a predetermined code series, i.e., a so-called spread spectrum signal. When two consecutive bits of signal have the same phase, a large correlation peak is output from the SAW device 120, while no output is obtained in the case of the opposite phase. The output of the SAW device 120 is input into the detection circuit 121, and an envelope is taken out. The data judging circuit 122 judges if the signal level surpasses a predetermined threshold, and hence data is demodulated.

Figure 4:
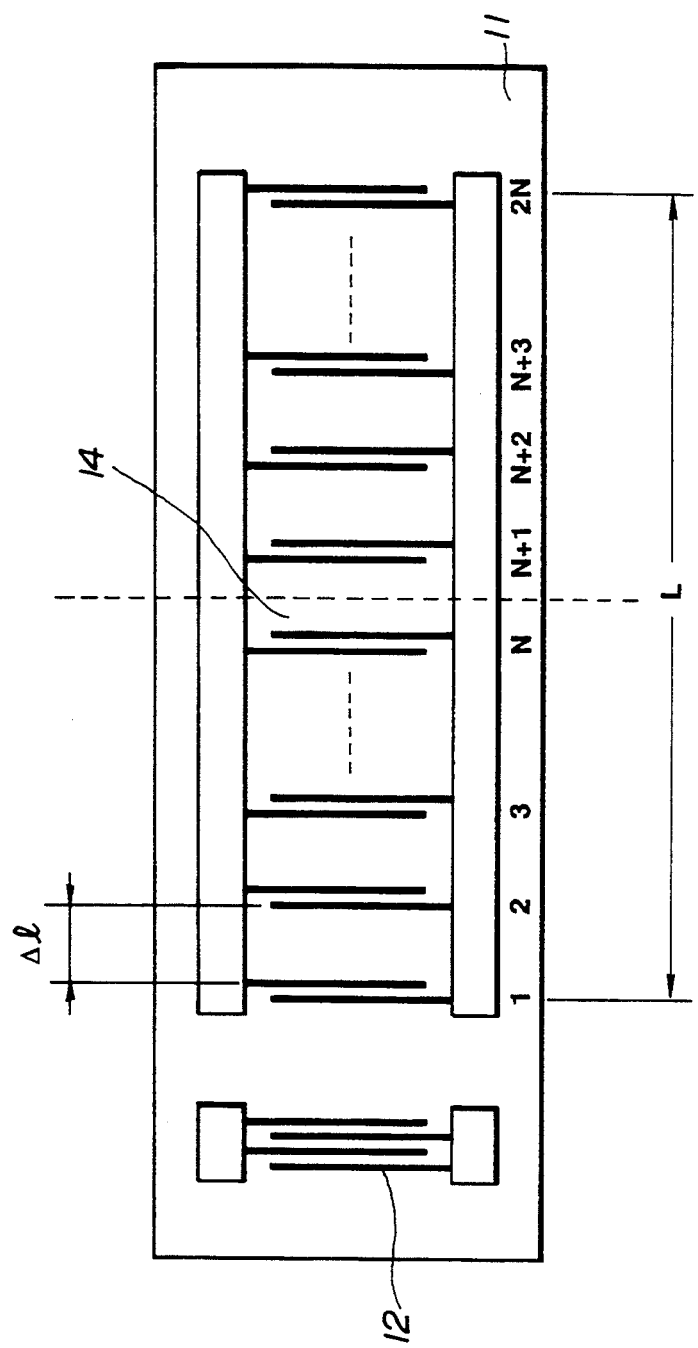
FIG. 4 is a schematic plan view showing a second embodiment of a SAW device according to the present invention.
Figure 5:
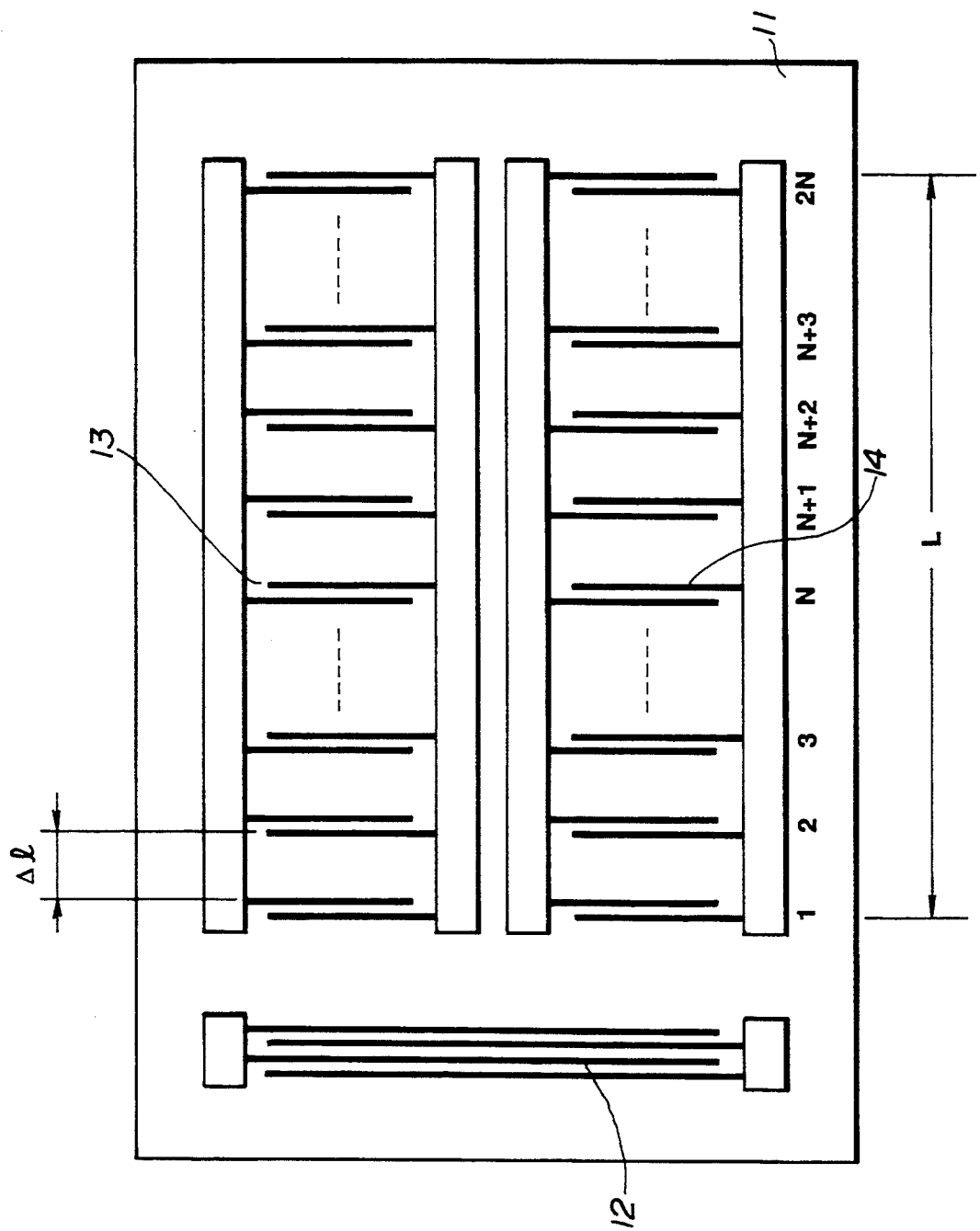
FIG. 5 is a schematic plan view showing a third embodiment of a SAW device according to the present invention.

The SAW device 120 may be a SAW device as shown in FIG. 4 in which two taps of the output electrode convert an unmodulated SAW to electric signals which have phases opposite to each other. The input and output electrodes of the SAW device may be replaced by each other. In this case, when two consecutive bits of the signal input into the SAW device 120 have the same phase, no output is obtained, while a large correlation peak can be obtained in the case of the opposite phase. Further, any one of the devices shown in FIGS. 5 to 8 may be used as the SAW device 120.

FIG. 11 is a block diagram showing another embodiment of the demodulating device of FIG. 9. In FIG. 11, reference numerals 201 and 202 respectively designate first and second SAW devices. Reference numerals 211 and 212 respectively designate detection circuits for envelope-detecting the outputs of the first and second SAW devices 201 and 202. Reference numeral 123 designates a comparator circuit for comparing the output levels of the detection circuits 211 and 212. Reference numeral 124 designates a branching device. In FIG. 11, amplifier, filter and so forth are omitted for simplicity, but they may be inserted in front and/or rear stage of the respective circuits when necessary.

The operation of this embodiment will be described. The received signal is input into the branching device 124 through amplifier, filter, frequency changer circuit and so forth (not shown). The signal is divided into two, and one is input into the first SAW device 201 while the other is input into the second SAW device 202.

The first SAW device 201 is a SAW device according to the present invention. The SAW device 201 is, for example, a SAW device of FIG. 3 in which taps of the output electrode arranged in a half region closer to the input electrode is composed of the same series of taps as that of taps arranged in the other half region remote from the input electrode. The input and output electrodes of the SAW device may be replaced by each other.

The second SAW device 202 is, for example, a SAW device of FIG. 4 in which taps of the output electrode arranged in a half region closer to the input electrode is composed of a series of taps whose phase is opposite to that of a series of taps arranged in the other half region remote from the input electrode. The input and output electrodes of the SAW device may be replaced by each other.

When the received signal is a signal modulated in accordance with a predetermined code series, i.e., a so-called spread spectrum signal, a large correlation peak is ouput from the first SAW device 201 if two consecutive bits of signal have the same phase, while a large correlation peak is output from the second SAW device 202 in the case of the opposite phase. The outputs of the first and second SAW devices 201 and 202 are respectively input into the detection circuits 211 and 212. Envelopes are taken out and their levels are compared with each other. Thus data is demodulated.

In this embodiment, since the outputs of the two SAW devices 201 and 202 are compared and data is judged, this embodiment is more resistant to level fluctuation of the received signal than the demodulating device shown in FIG. 10.

Instead of the SAW devices of FIGS. 3 and 4, a device of FIG. 6 may be used as the first SAW device 201 and a device of FIG. 7 may be used as the second SAW device 202. Further, the first and second SAW devices 201 and 202 may be combined into one as shown in FIG. 5 or FIG. 8.

As described in the foregoing, according to a SAW device of the present invention, it can be judged, merely by detecting the output level of the device, if two consecutive bits or signals remote from each other by N bits have the same phase or opposite phase. Therefore, when a demodulating device is structured by using such a SAW device, a delay circuit and a multiplier can be omitted. As a result, the circuit size can be reduced, and degradation of signal quality can be prevented.

Except as otherwise disclosed herein, the various components shown in outline or in block form in the figure are individually well-known in their internal construction and operation and are not critical either to the making or using of this invention or to a description of the best mode of the invention.

While the present invention has been described with respect to what is presently considered to be the preferred embodiments, it is to be understood that the invention is not limited to the disclosed embodiments. The present invention is intended to cover various modifications and equivalent arrangements included within the spirit and scope of the appended claims.

What is claimed is:

1. A surface acoustic wave device, said device comprising:
   a piezoelectric substrate;
   an input electrode for generating a surface acoustic wave propagated in a predetermined direction, in accordance with an input signal, said input electrode being formed on said substrate; and
   an output electrode for converting the surface acoustic wave to an electric signal, said output electrode being formed on said substrate; and
   wherein one of said input and output electrodes comprises a plurality of taps equidistantly arranged in a propagation direction of the surface acoustic wave and satisfies an equation $L+\Delta l=2V/A$ where L is a length of one of said input and output electrodes in the propagation direction, $\Delta l$ is a length of a space between said taps, A is a transmission speed of the input signal and V is a propagation velocity of the surface acoustic wave.

2. A surface acoustic wave device according to claim 1, wherein one of said input and output electrodes comprises a 2N number of taps (N is a natural number) and a signal polarity corresponding to the tap, which is the i-th one (i=1, 2, ..., N) counted from one side, is the same as a signal polarity corresponding to the (N+i)-th tap counted from the same side.

3. A surface acoustic wave device according to claim 1, wherein one of said input and output electrodes comprises a 2N number of taps (N is a natural number) and a signal polarity corresponding to the tap, which is the i-th one (i=1, 2, ..., N) counted from one side, is opposite to a signal polarity corresponding to the (N+i)-th tap counted from the same side.

4. A surface acoustic wave device according to claim 1, wherein each of said taps comprises a comb electrode which includes at least one pair of electrode digits.

5. A surface acoustic wave device, said device comprising:
   a piezoelectric substrate;
   an input electrode for generating a surface acoustic wave propagated in a predetermined direction, in accordance with an input signal, said input electrode being formed on said substrate; and
   an output electrode for converting the surface acoustic wave to an electric signal, said output electrode being formed on said substrate; and
   wherein one of said input and output electrodes comprises first and second electrodes which are arranged along a direction perpendicular to a propagation direction of the surface acoustic wave, said first and second electrodes respectively comprise a 2N number of taps (N is a natural number) which are equidistantly arranged in the propagation direction of the surface acoustic wave, said first electrode is structured so that a signal polarity corresponding to the tap, which is the i-th one (i=1, 2, ..., N) counted from one side, is the same as a signal polarity corresponding to the (N+i)-th tap counted from the same side, said second electrode is structured so that a signal polarity corresponding to the tap, which is the i-th one (i=1, 2, ..., N) counted from one side, is opposite to a signal polarity corresponding to the (N+i)-th tap counted from the same side, and said first and second electrodes respectively satisfy an equation $L+\Delta l=2V/A$ where L is a length of each of said first and second electrodes in the propagation direction, $\Delta l$ is a length of a space between said taps, A is a transmission speed of the input signal and V is a propagation velocity of the surface acoustic wave.

6. A surface acoustic wave device according to claim 5, wherein each of said taps comprises a comb electrode which includes at least one pair of electrode digits.

7. A demodulating device comprising:
   (a) a surface acoustic wave device for supplying a correlation signal based on an input signal modulated in accordance with data, said surface acoustic wave device comprising:
      a piezoelectric substrate;
      an input electrode for generating a surface acoustic wave propagated in a predetermined direction, in accordance with an input signal, said input electrode being formed on said substrate; and
      an output electrode for converting the surface acoustic wave to an electric signal, said output electrode being formed on said substrate;
      wherein one of said input and output electrodes comprises a plurality of taps equidistantly arranged in a propagation direction of the surface acoustic wave and satisfies an equation $L+\Delta l=2V/A$ where L is a length of one of said input and output electrodes in the propagation direction, $\Delta l$ is a length of a space between said taps, A is a transmission speed of the input signal and V is a propagation velocity of the surface acoustic wave;
   (b) a detection circuit for envelope-detecting the correlation signal supplied from said surface acoustic wave device to supply an output; and
   (c) a data judging circuit for judging the data based on the output from said detection circuit.

8. A demodulating device according to claim 7, wherein one of said input and output electrodes comprises a 2N number of taps (N is a natural number) and a signal polarity corresponding to the tap, which is the i-th one (i=1, 2, ..., N) counted from one side, is the same as a signal polarity corresponding to the (N+i)-th tap counted from the same side.

9. A demodulating device according to claim 7, wherein one of said input and output electrodes comprises a 2N number of taps (N is a natural number) and a signal polarity corresponding to the tap, which is the i-th one (i=1, 2, ..., N) counted from one side, is opposite to a signal polarity corresponding to the (N+i)-th tap counted from the same side.

10. A demodulating device according to claim 7, wherein each of said taps comprises a comb electrode which includes at least one pair of electrode digits.

11. A demodulating device according to claim 7, wherein the input signal is a spread spectrum signal.

12. A demodulating device comprising:
   (a) a surface acoustic wave device for supplying a correlation signal based on an input signal modulated in accordance with data, said surface acoustic wave device comprising:
      a piezoelectric substrate;
      an input electrode for generating a surface acoustic wave propagated in a predetermined direction, in accordance with an input signal, said input electrode being formed on said substrate; and
      an output electrode for converting the surface acoustic wave to an electric signal, said output electrode being formed on said substrate;
      wherein one of said input and output electrodes comprises first and second electrodes which are arranged along a direction perpendicular to a propagation direction of the surface acoustic wave, said first and second electrodes respectively comprise a 2N number of taps (N is a natural number) which are equidistantly arranged in the propagation direction of the surface acoustic wave, said first electrode is structured so that a signal polarity corresponding to the tap, which is the i-th one (i=1, 2, ..., N) counted from one side, is the same as a signal polarity corresponding to the (N+i)-th tap counted from the same side, said second electrode is structured so that a signal polarity corresponding to the tap, which is the i-th one (i=1, 2, ..., N) counted from one side, is opposite to a signal polarity corresponding to the (N+i)-th tap counted from the same side, and said first and second electrodes respectively satisfy an equation $L+\Delta l=2V/A$ where L is a length of each of said first and second electrodes in the propagation direction, $\Delta l$ is a length of a space between said taps, A is a transmission speed of the input signal and V is a propagation velocity of the surface acoustic wave;
   (b) a detection circuit for envelope-detecting the correlation signal supplied from said surface acoustic wave device to supply an output; and
   (c) a data judging circuit for judging the data based on the output from said detection circuit.

13. A demodulating device according to claim 12, wherein each of said taps comprises a comb electrode which includes at least one pair of electrode digits.

14. A demodulating device according to claim 12, wherein the input signal is a spread spectrum signal.

15. A communication system comprising:
(a) a transmitter for transmitting a signal modulated in accordance with data;
(b) a receiver circuit for receiving the signal transmitted from said transmitter;
(c) a surface acoustic wave device for supplying a correlation signal based on the signal received by said receiver circuit, said surface acoustic wave device comprising:
a piezoelectric substrate;
an input electrode for generating a surface acoustic wave propagated in a predetermined direction, in accordance with the received signal, said input electrode being formed on said substrate; and
an output electrode for receiving the surface acoustic wave and supplying the correlation signal, said output electrode being formed on said substrate;
wherein one of said input and output electrodes comprises a plurality of taps equidistantly arranged in a propagation direction of the surface acoustic wave and satisfies an equation $L+\Delta l=2V/A$ where L is a length of one of said input and output electrodes in the propagation direction, $\Delta l$ is a length of a space between said taps, A is a transmission speed of the input signal and V is a propagation velocity of the surface acoustic wave;
(d) a detection circuit for envelope-detecting the correlation signal supplied from said surface acoustic wave device to supply an output; and
(e) a data judging circuit for judging the data based on the output from said detection circuit.

16. A communication system according to claim 15, wherein one of said input and output electrodes comprises a 2N number of taps (N is a natural number) and a signal polarity corresponding to the tap, which is the i-th one ($i=1, 2, \ldots, N$) counted from one side, is the same as a signal polarity corresponding to the (N+i)-th tap counted from the same side.

17. A communication system according to claim 15, wherein one of said input and output electrodes comprises a 2N number of taps (N is a natural number) and a signal polarity corresponding to the tap, which is the i-th one ($i=1, 2, \ldots, N$) counted from one side, is opposite to a signal polarity corresponding to the (N+i)-th tap counted from the same side.

18. A communication system according to claim 15, wherein each of said taps comprises a comb electrode which includes at least one pair of electrode digits.

19. A communication system according to claim 15, wherein the input signal is a spread spectrum signal.

20. A communication system comprising:
(a) a transmitter for transmitting a signal modulated in accordance with data;
(b) a receiver circuit for receiving the signal transmitted from said transmitter;
(c) a surface acoustic wave device for supplying a correlation signal based on the signal received by said receiver circuit, said surface acoustic wave device comprising:
a piezoelectric substrate;
an input electrode for generating a surface acoustic wave propagated in a predetermined direction, in accordance with the received signal, said input electrode being formed on said substrate; and
an output electrode for receiving the surface acoustic wave and supplying the correlation signal, said output electrode being formed on said substrate;
wherein one of said input and output electrodes comprises first and second electrodes which are arranged along a direction perpendicular to a propagation direction of the surface acoustic wave, said first and second electrodes respectively comprise a 2N number of taps (N is a natural number) which are equidistantly arranged in the propagation direction of the surface acoustic wave, said first electrode is structured so that a signal polarity corresponding to the tap, which is the i-th one ($i=1, 2, \ldots, N$) counted from one side, is the same as a signal polarity corresponding to the (N+i)-th tap counted from the same side, said second electrode is structured so that a signal polarity corresponding to the tap, which is the i-th one ($i=1, 2, \ldots, N$) counted from one side, is opposite to a signal polarity corresponding to the (N+i)-th tap counted from the same side, and said first and second electrodes respectively satisfy an equation $L+\Delta l=2V/A$ where L is a length of each of said first and second electrodes in the propagation direction, $\Delta l$ is a length of a space between said taps, A is a transmission speed of the input signal and V is a propagation velocity of the surface acoustic wave;
(d) a detection circuit for envelope-detecting the correlation signal supplied from said surface acoustic wave device to supply an output; and
(e) a data judging circuit for judging the data based on the output from said detection circuit.

21. A communication system according to claim 20, wherein each of said taps comprises a comb electrode which includes at least one pair of electrode digits.

22. A communication system according to claim 20, wherein the input signal is a spread spectrum signal.

23. A demodulating device comprising:
(a) a branching device for dividing a signal modulated in accordance with data into first and second input signals;
(b) a first surface acoustic wave device for supplying a first correlation signal based on the first input signal divided by said branching device, said first surface acoustic wave device comprising:
a piezoelectric substrate;
an input electrode for generating a surface acoustic wave propagated in a predetermined direction, in accordance with the input signal, said input electrode being formed on said substrate; and
an output electrode for receiving the surface acoustic wave and supplying the correlation signal, said output electrode being formed on said substrate;
wherein one of said input and output electrodes comprises a plurality of taps equidistantly arranged in a propagation direction of the surface acoustic wave, is structured so that a signal polarity corresponding to the tap, which is the i-th one ($i=1, 2, \ldots, N$) counted from one side, is the same as a signal polarity corresponding to the (N+i)-th tap counted from the same side, and satisfies an equation $L+\Delta l=2V/A$ where L is a length of one of said input and output electrodes in the propagation direction, $\Delta l$ is a length of a space between said taps, A is a transmission speed of the input signal and V is a propagation velocity of the surface acoustic wave;

(c) a second surface acoustic wave device for supplying a second correlation signal based on the second input signal divided by said branching device, said second surface acoustic wave device comprising:
a piezoelectric substrate;
an input electrode for generating a surface acoustic wave propagated in a predetermined direction, in accordance with the input signal, said input electrode being formed on said substrate; and
an output electrode for receiving the surface acoustic wave and supplying the correlation signal, said output electrode being formed on said substrate;
wherein one of said input and output electrodes comprises a plurality of taps equidistantly arranged in a propagation direction of the surface acoustic wave, is structured so that a signal polarity corresponding to the tap, which is the i-th one (i=1, 2, ..., N) counted from one side, is opposite to a signal polarity corresponding to the (N+i)-th tap counted from the same side, and satisfies an equation $L+\Delta l=2V/A$ where L is a length of one of said input and output electrodes in the propagation direction, $\Delta l$ is a length of a space between said taps, A is a transmission speed of the input signal and V is a propagation velocity of the surface acoustic wave;

(d) a first detection circuit for envelope-detecting the first correlation signal supplied from said first surface acoustic wave device to supply an output; and (e) a second detection circuit for envelope-detecting the second correlation signal supplied from said second surface acoustic wave device to supply an output; and (f) a comparator circuit for comparing the outputs supplied from said first and second detection circuits.

24. A demodulating device according to claim 23, wherein each of said taps comprises a comb electrode which includes at least one pair of electrode digits.

25. A demodulating device according to claim 23, wherein the input signal is a spread spectrum signal.

26. A communication system comprising:
(a) a transmitter for transmitting a signal modulated in accordance with data;
(b) a receiver circuit for receiving the signal transmitted from said transmitter;
(c) a branching device for dividing the signal received by said receiver circuit into first and second input signals;
(d) a first surface acoustic wave device for supplying a first correlation signal based on the first input signal divided by said branching device, said first surface acoustic wave device comprising:
a piezoelectric substrate;
an input electrode for generating a surface acoustic wave propagated in a predetermined direction, in accordance with the input signal, said input electrode being formed on said substrate; and
an output electrode for receiving the surface acoustic wave and supplying the correlation signal, said output electrode being formed on said substrate;
wherein one of said input and output electrodes comprises a 2N number of taps (n is a natural number) equidistantly arranged in a propagation direction of the surface acoustic wave, is structured so that a signal polarity corresponding to the tap, which is the i-th one (i=1, 2, ..., N) counted from one side, is the same as a signal polarity corresponding to the (N+i)-th tap counted from the same side, and satisfies an equation $L+\Delta l=2V/A$ where L is a length of one of said input and output electrodes in the propagation direction, $\Delta l$ is a length of a space between said taps, A is a transmission speed of the input signal and V is a propagation velocity of the surface acoustic wave;

(e) a second surface acoustic wave device for supplying a second correlation signal based on the second input signal divided by said branching device, said second surface acoustic wave device comprising:
a piezoelectric substrate;
an input electrode for generating a surface acoustic wave propagated in a predetermined direction, in accordance with the input signal, said input electrode being formed on said substrate; and
an output electrode for receiving the surface acoustic wave and supplying the correlation signal, said output electrode being formed on said substrate;
wherein one of said input and output electrodes comprises a plurality of taps equidistantly arranged in a propagation direction of the surface acoustic wave, is structured so that a signal polarity corresponding to the tap, which is the i-th one (i=1, 2, ..., N) counted from one side, is opposite to a signal polarity corresponding to the (N+i)-th tap counted from the same side, and satisfies an equation $L+\Delta l=2V/A$ where L is a length of one of said input and output electrodes in the propagation direction, $\Delta l$ is a length of a space between said taps, A is a transmission speed of the input signal and V is a propagation velocity of the surface acoustic wave;

(e) a first detection circuit for envelope-detecting the first correlation signal supplied from said first surface acoustic wave device to supply an output; and (f) a second detection circuit for envelope-detecting the second correlation signal supplied from said second surface acoustic wave device to supply an output; and (g) a comparator circuit for comparing the outputs supplied from said first and second detection circuits.

27. A communication system according to claim 26, wherein each of said taps comprises a comb electrode which includes at least one pair of electrode digits.

28. A communication system according to claim 26, wherein the input signal is a spread spectrum signal.

29. A surface acoustic wave device, said device comprising:
a piezoelectric substrate;
an input electrode for generating a surface acoustic wave propagated in a predetermined direction, in accordance with an input signal, said input electrode being formed on said substrate; and an output electrode for converting the surface acoustic wave to an electric signal, said output electrode being formed on said substrate; and wherein one of said input and output electrodes comprises a plurality of taps equidistantly arranged in a propagation direction of the surface acoustic wave, the other one of said input and output electrodes comprises first and second taps arranged at a predetermined distance in the propagation direction, and said the other electrode satisfies an equation $D=nV/A$ where D is a distance between center lines of said first and second taps in the propagation direction, A is a transmission speed of the input signal, V is a propagation velocity of the surface acoustic wave and n is a positive integer.

30. A surface acoustic wave device according to claim 29, a signal polarity corresponding to said first tap is the same as a signal polarity corresponding to the second tap.

31. A surface acoustic wave device according to claim 29, a signal polarity corresponding to said first tap is opposite to a signal polarity corresponding to the second tap.

32. A surface acoustic wave device according to claim 29, wherein each of said taps of said one electrode, and said first and second taps respectively comprise a comb electrode which includes at least one pair of electrode digits.

33. A surface acoustic wave device, said device comprising:
a piezoelectric substrate;
an input electrode for generating a surface acoustic wave propagated in a predetermined direction, in accordance with an input signal, said input electrode being formed on said substrate; and
an output electrode for converting the surface acoustic wave to an electric signal, said output electrode being formed on said substrate;
wherein one of said input and output electrodes comprises a plurality of taps equidistantly arranged in a propagation direction of the surface acoustic wave, the other one of said input and output electrodes comprises first and second electrodes arranged in a direction perpendicular to the propagation direction, said first electrode comprises first and second taps arranged at a predetermined distance in the propagation direction, said second electrode comprises third and fourth taps arranged at a predetermined distance in the propagation diraction, and said first and second electrodes respectively satisfy an equation $D=nV/A$ where D is a distance between center lines of said first and second taps in the propagation direction, A is a transmission speed of the input signal, V is a propagation velocity of the surface acoustic wave and n is a positive integer.

34. A surface acoustic wave device according to claim 33, wherein each of said taps of said one electrode, and said first, second, third and fourth taps respectively comprise a comb electrode which includes at least one pair of electrode digits.

35. A demodulating device comprising:
(a) a surface acoustic wave device for supplying a correlation signal based on an input signal modulated in accordance with data, said surface acoustic wave device comprising:
a piezoelectric substrate;
an input electrode for generating a surface acoustic wave propagated in a predetermined direction, in accordance with an input signal, said input electrode being formed on said substrate; and
an output electrode for receiving the surface acoustic wave and supplying the correlation signal, said output electrode being formed on said substrate;
wherein one of said input and output electrodes comprises a plurality of taps equidistantly arranged in a propagation direction of the surface acoustic wave, the other one of said input and output electrodes comprises first and second taps arranged at a predetermined distance in the propagation direction, and said the other electrode satisfies an equation $D=nV/A$ where D is a distance between center lines of said first and second taps in the propagation direction, A is a transmission speed of the input signal, V is a propagation velocity of the surface acoustic wave and n is a positive integer;
(b) a detection circuit for envelope-detecting the correlation signal supplied from said surface acoustic wave device to supply an output; and
(c) a data judging circuit for judging the data based on the output from said detection circuit.

36. A demodulating device according to claim 35, wherein a signal polarity corresponding to said first tap is the same as a signal polarity corresponding to the second tap.

37. A demodulating device according to claim 35, a signal polarity corresponding to said first tap is opposite to a signal polarity corresponding to the second tap.

38. A demodulating device according to claim 35, wherein each of said taps of said one electrode, and said first and second taps respectively comprise a comb electrode which includes at least one pair of electrode digits.

39. A demodulating device according to claim 35, wherein the input signal is a spread spectrum signal.

40. A demodulating device comprising:
(a) a surface acoustic wave device for supplying a correlation signal based on an input signal modulated in accordance with data, said surface acoustic wave device comprising:
a piezoelectric substrate;
an input electrode for generating a surface acoustic wave propagated in a predetermined direction, in accordance with an input signal, said input electrode being formed on said substrate; and
an output electrode for receiving the surface acoustic wave and supplying the correlation signal, said output electrode being formed on said substrate;
wherein one of said input and output electrodes comprises a plurality of taps equidistantly arranged in a propagation direction of the surface acoustic wave, the other one of said input and output electrodes comprises first and second electrodes arranged in a direction perpendicular to the propagation direction, said first electrode comprises first and second taps arranged at a predetermined distance in the propagation direction, said second electrode comprises third and fourth taps arranged at a predetermined distance in the propagation diraction, and said first and second electrodes respectively satisfy an equation $D=nV/A$ where D is a distance between center lines of said first and second taps in the propagation direction, A is a transmission speed of the input signal, V is a propagation velocity of the surface acoustic wave and n is a positive integer;

(b) a detection circuit for envelope-detecting the correlation signal supplied from said surface acoustic wave device to supply an output; and (c) a data judging circuit for judging the data based on the output from said detection circuit.

41. A demodulating device according to claim 40, wherein each of said taps of said one electrode, and said first, second, third and fourth taps respectively comprise a comb electrode which includes at least one pair of electrode digits.

42. A demodulating device according to claim 40, wherein the input signal is a spread spectrum signal.

43. A communication system comprising:

(a) a transmitter for transmitting a signal modulated in accordance with data;

(b) a receiver circuit for receiving the signal transmitted from said transmitter;

(c) a surface acoustic wave device for supplying a correlation signal based on the signal received by said receiver circuit, said surface acoustic wave device comprising:

a piezoelectric substrate;

an input electrode for generating a surface acoustic wave propagated in a predetermined direction, in accordance with the received signal, said input electrode being formed on said substrate; and an output electrode for receiving the surface acoustic wave and supplying the correlation signal, said output electrode being formed on said substrate;

wherein one of said input and output electrodes comprises a plurality of taps equidistantly arranged in a propagation direction of the surface acoustic wave, the other one of said input and output electrodes comprises first and second taps arranged at a predetermined distance in the propagation direction, and said the other electrode satisfies an equation $D=nV/A$ where D is a distance between center lines of said first and second taps in the propagation direction, A is a transmission speed of the input signal, V is a propagation velocity of the surface acoustic wave and n is a positive integer;

(d) a detection circuit for envelope-detecting the correlation signal supplied from said surface acoustic wave device to supply an output; and (e) a data judging circuit for judging the data based on the output from said detection circuit.

44. A communication system according to claim 43, wherein a signal polarity corresponding to said first tap is the same as a signal polarity corresponding to the second tap.

45. A communication system according to claim 43, wherein, wherein a signal polarity corresponding to said first tap is opposite to a signal polarity corresponding to said second tap.

46. A communication system according to claim 43, wherein each of said taps of said one electrode, and said first and second taps respectively comprise a comb electrode which includes at least one pair of electrode digits.

47. A communication system according to claim 43, wherein the input signal is a spread spectrum signal.

48. A communication system comprising:

(a) a transmitter for transmitting a signal modulated in accordance with data;

(b) a receiver circuit for receiving the signal transmitted from said transmitter;

(c) a surface acoustic wave device for supplying a correlation signal based on the signal received by said receiver circuit, said surface acoustic wave device comprising:

a piezoelectric substrate;

an input electrode for generating a surface acoustic wave propagated in a predetermined direction, in accordance with the received signal, said input electrode being formed on said substrate; and an output electrode for receiving the surface acoustic wave and supplying the correlation signal, said output electrode being formed on said substrate;

wherein one of said input and output electrodes comprises a plurality of taps equidistantly arranged in a propagation direction of the surface acoustic wave, the other one of said input and output electrodes comprises first and second electrodes arranged in a direction perpendicular to the propagation direction, said first electrode comprises first and second taps arranged at a predetermined distance in the propagation direction, said second electrode comprises third and fourth taps arranged at a predetermined distance in the propagation diraction, and said first and second electrodes respectively satisfy an equation $D=nV/A$ where D is a distance between center lines of said first and second taps in the propagation direction, A is a transmission speed of the input signal, V is a propagation velocity of the surface acoustic wave and n is a positive integer;

(d) a detection circuit for envelope-detecting the correlation signal supplied from said surface acoustic wave device to supply an output; and (e) a data judging circuit for judging the data based on the output from said detection circuit.

49. A communication system according to claim 48, wherein each of said taps of said one electrode, and said first, second, third and fourth taps respectively comprise a comb electrode which includes at least one pair of electrode digits.

50. A communication system according to claim 48, wherein the input signal is a spread spectrum signal.

51. A demodulating device comprising:

(a) a branching device for dividing a signal modulated in accordance with data into first and second input signals;

(b) a first surface acoustic wave device for supplying a first correlation signal based on the first input signal divided by said branching device, said first surface acoustic wave device comprising:

a piezoelectric substrate;

an input electrode for generating a surface acoustic wave propagated in a predetermined direction, in accordance with the input signal, said input electrode being formed on said substrate; and an output electrode for converting the surface acoustic wave to an electric signal, said output electrode being formed on said substrate;

wherein one of said input and output electrodes comprises a plurality of taps equidistantly arranged in a propagation direction of the surface acoustic wave, the other one of said input and output electrodes comprises first and second taps arranged at a predetermined distance in the propagation direction, a signal polarity corresponding to said first tap is the same as a signal polarity corresponding to said second tap, and said the other electrode satisfies an equation $D=nV/A$ where D is a distance between center lines of said first and second taps in the propagation direction, A is a transmission speed of the input signal, V is a propagation velocity of the surface acoustic wave and n is a positive integer;

(c) a second surface acoustic wave device for supplying a second correlation signal based on the second input signal divided by said branching device, said second surface acoustic wave device comprising:
a piezoelectric substrate;
an input electrode for generating a surface acoustic wave propagated in a predetermined direction, in accordance with the input signal, said input electrode being formed on said substrate; and
an output electrode for converting the surface acoustic wave to an electric signal, said output electrode being formed on said substrate;
wherein one of said input and output electrodes comprises a plurality of taps equidistantly arranged in a propagation direction of the surface acoustic wave, the other one of said input and output electrodes comprises third and fourth taps arranged at a predetermined distance in the propagation direction, a signal polarity corresponding to said third tap is opposite to a signal polarity corresponding to said fourth tap, and said the other electrode satisfies an equation $D=nV/A$ where D is a distance between center lines of said third and fourth taps in the propagation direction, A is a transmission speed of the input signal, V is a propagation velocity of the surface acoustic wave and n is a positive integer;

(d) a first detection circuit for envelope-detecting the first correlation signal supplied from said first surface acoustic wave device to supply an output; and (e) a second detection circuit for envelope-detecting the second correlation signal supplied from said second surface acoustic wave device to supply an output; and (f) a comparator circuit for comparing the outputs supplied from said first and second detection circuits.

52. A demodulating device according to claim 51, wherein each of said taps of said one electrode, and said first, second, third and fourth taps comprise a comb electrode which includes at least one pair of electrode digits.

53. A demodulating device according to claim 51, wherein the input signal is a spread spectrum signal.

54. A communication system comprising:
(a) a transmitter for transmitting a signal modulated in accordance with data;
(b) a receiver circuit for receiving the signal transmitted from said transmitter;
(c) a branching device for dividing the signal received by said receiver circuit into first and second input signals;

(d) a first surface acoustic wave device for supplying a first correlation signal based on the first input signal divided by said branching device, said first surface acoustic wave device comprising:
a piezoelectric substrate;
an input electrode for generating a surface acoustic wave propagated in a predetermined direction, in accordance with the input signal, said input electrode being formed on said substrate; and
an output electrode for converting the surface acoustic wave to an electric signal, said output electrode being formed on said substrate;
wherein one of said input and output electrodes comprises a plurality of taps equidistantly arranged in a propagation direction of the surface acoustic wave, the other one of said input and output electrodes comprises first and second taps arranged at a predetermined distance in the propagation direction, a signal polarity corresponding to said first tap is the same as a signal polarity corresponding to said second tap and said the other electrode satisfies an equation $D=nV/A$ where D is a distance between center lines of said first and second taps in the propagation direction, A is a transmission speed of the input signal, V is a propagation velocity of the surface acoustic wave and n is a positive integer;

(e) a second surface acoustic wave device for supplying a second correlation signal based on the second input signal divided by said branching device, said second surface acoustic wave device comprising:
a piezoelectric substrate;
an input electrode for generating a surface acoustic wave propagated in a predetermined direction, in accordance with the input signal, said input electrode being formed on said substrate; and
an output electrode for converting the surface acoustic wave to an electric signal, said output electrode being formed on said substrate;
wherein one of said input and output electrodes comprises a plurality of taps equidistantly arranged in a propagation direction of the surface acoustic wave, the other one of said input and output electrodes comprises third and fourth taps arranged at a predetermined distance in the propagation direction, a signal polarity corresponding to said third tap is opposite to a signal polarity corresponding to said fourth tap and said the other electrode satisfies an equation $D=nV/A$ where D is a distance between center lines of said third and fourth taps in the propagation direction, A is a transmission speed of the input signal, V is a propagation velocity of the surface acoustic wave and n is a positive integer;

(e) a first detection circuit for envelope-detecting the first correlation signal supplied from said first surface acoustic wave device to supply an output; and (f) a second detection circuit for envelope-detecting the second correlation signal supplied from said second surface acoustic wave device to supply an output; and (g) a comparator circuit for comparing the outputs supplied from said first and second detection circuits.

55. A communication system according to claim 54, wherein each of said taps of said one electrode, and said first, second, third and fourth taps respectively comprise a comb electrode which includes at least one pair of electrode digits.

56. A communication system according to claim 54, wherein the input signal is a spread spectrum signal.

57. A method for demodulating data by using a surface acoustic wave device comprising a piezoelectric substrate, an input electrode for generating a surface acoustic wave propagated in a predetermined direction in accordance with an input signal, said input electrode being formed on said substrate, and an output electrode formed on said substrate, wherein one of said input and output electrodes comprises a plurality of taps arranged equidistantly in a propagation direction of the surface acoustic wave and satisfies an equation $L+\Delta l=2V/A$ where L is a length of one of said input and output electrodes in the propagation direction of the surface acoustic wave, $\Delta l$ is a length of a space between said taps, A is a transmission speed of the input signal and V is a propagation velocity of the surface acoustic wave, said method comprising the steps of:
generating the surface acoustic wave by inputting the input signal modulated in accordance with the data;
converting the surface acoustic wave to an electric signal by said output electrode; and
demodulating the data from the electric signal.

58. A method for demodulating data according to claim 57, wherein the step for demodulating data comprises a step for envelope-detecting the electric signal and a step for judging the data from the envelope-detected signal.

59. A method for demodulating data according to claim 57, wherein the input signal is a spread spectrum signal.

60. A method for demodulating data according to claim 57, wherein the input signal is a differential phase-shifted keyed signal.

61. A method for demodulating data according to claim 57, wherein one of said input and output electrodes comprises 2N taps (N is a natural number), and a signal polarity corresponding to the tap, which is the i-th one (i=1, 2 ..., N) counted from one side, is the same as a signal polarity corresponding to the (N+i)-th tap counted from the same side.

62. A method for demodulating data according to claim 57, wherein one of said input and output electrodes comprises 2N taps (N is a natural number), and a signal polarity corresponding to the tap, which is the i-th one (i=1, 2 ..., N) counted from one side, is opposite to a signal polarity corresponding to the (N+i)-th tap counted from the same side.

63. A method for demodulating data according to claim 57, wherein each of said taps comprises a comb electrode which includes at least one pair of electrode digits.

64. A method for demodulating data by using a surface acoustic wave device comprising a piezoelectric substrate, an input electrode for generating a surface acoustic wave propagated in a predetermined direction in accordance with an input signal, said input electrode being formed on said substrate, and an output electrode formed on said substrate, wherein one of said input and output electrodes comprises a plurality of taps arranged equidistantly in a propagation direction of the surface acoustic wave, the other one of said input and output electrodes comprises first and second taps arranged at a predetermined distance in the propagation direction of the surface acoustic wave, and the other one of said input and output electrodes satisfies an equation $D=nV/A$ where D is a distance between center lines of said first and second taps in the propagation direction of the surface acoustic wave, A is a transmission speed of the input signal, V is a propagation velocity of the surface acoustic wave and n is a positive integer, said method comprising the steps of:
generating the surface acoustic wave by inputting the input signal modulated in accordance with the data;
converting the surface acoustic wave to an electric signal by said output electrode; and
demodulating the data from the electric signal.

65. A method for demodulating data according to claim 64, wherein the step for demodulating the data comprises a step for envelope-detecting the electric signal and a step for judging the data from the envelope-detected signal.

66. A method for demodulating data according to claim 64, wherein the input signal is a spread spectrum signal.

67. A method for demodulating data according to claim 64, wherein the input signal is a differential phase-shifted keyed signal.

68. A method for demodulating data according to claim 64, wherein a signal polarity corresponding to said first tap is the same as a signal polarity corresponding to said second tap.

69. A method for demodulating data according to claim 64, wherein a signal polarity corresponding to said first tap is opposite to a signal polarity corresponding to said second tap.

70. A method for demodulating data according to claim 64, wherein each of said taps of said one electrode, and said first and second taps of the other electrode respectively comprise a comb electrode which includes at least one pair of electrode digits.

* * * * *

UNITED STATES PATENT AND TRADEMARK OFFICE
CERTIFICATE OF CORRECTION

PATENT NO. : 5,353,304
DATED : October 4, 1994
INVENTOR(S) : Norihiro Mochizuki

It is certified that error appears in the above-indentified patent and that said Letters Patent is hereby corrected as shown below:

COLUMN 2

Line 33, "arc" should read --are--.

COLUMN 4

Line 29, "a 2N number of" should read --2N--.

COLUMN 6

Line 20, "electordes" should read --electrodes--.

COLUMN 15

Line 1, "N," should read --N taps,--.

COLUMN 25

Line 49, "diraction," should read --direction,--.

COLUMN 26

Line 66, "diraction," should read --direction,--.

UNITED STATES PATENT AND TRADEMARK OFFICE
CERTIFICATE OF CORRECTION

PATENT NO. : 5,353,304
DATED : October 4, 1994
INVENTOR(S) : Norihiro Mochizuki

It is certified that error appears in the above-indentified patent and that said Letters Patent is hereby corrected as shown below:

COLUMN 28

Line 33, "diraction," should read --direction,--.

Signed and Sealed this

Twenty-fifth Day of April, 1995

Attest:

BRUCE LEHMAN

Attesting Officer    Commissioner of Patents and Trademarks